(12) United States Patent
Chen et al.

(10) Patent No.: US 11,901,486 B2
(45) Date of Patent: Feb. 13, 2024

(54) METHOD FOR TRANSFERRING CHIP, DISPLAY DEVICE, CHIP AND TARGET SUBSTRATE

(71) Applicant: BOE TECHNOLOGY GROUP CO., LTD., Beijing (CN)

(72) Inventors: Liang Chen, Beijing (CN); Lei Wang, Beijing (CN); Minghua Xuan, Beijing (CN); Dongni Liu, Beijing (CN); Li Xiao, Beijing (CN); Detao Zhao, Beijing (CN); Hao Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 588 days.

(21) Appl. No.: 17/256,185

(22) PCT Filed: Apr. 3, 2020

(86) PCT No.: PCT/CN2020/083299
§ 371 (c)(1),
(2) Date: Dec. 25, 2020

(87) PCT Pub. No.: WO2020/216046
PCT Pub. Date: Oct. 29, 2020

(65) Prior Publication Data
US 2021/0273133 A1    Sep. 2, 2021

(30) Foreign Application Priority Data

Apr. 24, 2019    (CN) .......................... 201910333496.7

(51) Int. Cl.
*H01L 33/00* (2010.01)
*H01L 23/00* (2006.01)
*H01L 33/20* (2010.01)

(52) U.S. Cl.
CPC .............. *H01L 33/20* (2013.01); *H01L 24/81* (2013.01); *H01L 33/005* (2013.01); *H01L 24/14* (2013.01); *H01L 2933/0066* (2013.01)

(58) Field of Classification Search
CPC ....... H01L 33/20; H01L 33/005; H01L 24/81; H01L 24/14; H01L 2224/1403;
(Continued)

(56) References Cited

U.S. PATENT DOCUMENTS

2008/0023435 A1*  1/2008  Wu .......................... H01L 25/50
                                                                     257/E21.705
2009/0017670 A1   1/2009  Hattori
(Continued)

FOREIGN PATENT DOCUMENTS

CN    101345225 A    1/2009
CN    102903696 A    1/2013
(Continued)

OTHER PUBLICATIONS

International search report of PCT application No. PCT/CN2020/083299 dated Jul. 8, 2020.
(Continued)

*Primary Examiner* — Didarul A Mazumder
(74) *Attorney, Agent, or Firm* — Lippes Mathias LLP

(57) ABSTRACT

Provided is a method for transferring a chip, including: disposing a target substrate in a sealed chamber; applying charges of different polarities to a first alignment bonding structure of the target substrate and a first chip bonding structure of the chip, and injecting an insulation fluid flowing in a first direction into the sealed chamber, so that the first chip bonding structure is aligned with the first alignment bonding structure; applying charges of different polarities to a second alignment bonding structure of the target substrate and a second chip bonding structure of the chip,
(Continued)

and changing the flowing direction of the insulation fluid to a second direction, so that the second chip bonding structure is aligned with the second alignment bonding structure; and applying a bonding force to the chip, so that the chip bonding structures is bonded to the alignment bonding structures.

20 Claims, 13 Drawing Sheets

(58) Field of Classification Search
CPC . H01L 2224/14051; H01L 2224/14517; H01L 2933/0066
USPC ............................. 257/79, 737; 438/22, 613
See application file for complete search history.

(56) References Cited

U.S. PATENT DOCUMENTS

| | | | | |
|---|---|---|---|---|
| 2012/0049350 | A1* | 3/2012 | Grillberger | H01L 21/4853 257/737 |
| 2013/0026620 | A1 | 1/2013 | Huang et al. | |
| 2014/0127864 | A1 | 5/2014 | Chuang et al. | |
| 2015/0091187 | A1* | 4/2015 | Reber | H01L 24/16 438/109 |
| 2015/0369461 | A1 | 12/2015 | Yokotani et al. | |
| 2018/0374738 | A1* | 12/2018 | Lee | H01L 33/0095 |

FOREIGN PATENT DOCUMENTS

| | | |
|---|---|---|
| CN | 103811363 A | 5/2014 |
| CN | 107706123 A | 2/2018 |
| CN | 108461439 A | 8/2018 |
| CN | 109599463 A | 4/2019 |
| CN | 110061106 A | 7/2019 |

OTHER PUBLICATIONS

First office action of Chinese application No. 201910333496.7 dated Dec. 9, 2019.

Notification to grant patent right for invention of Chinese application No. 201910333496.7 dated Feb. 26, 2020.

* cited by examiner

METHOD FOR TRANSFERRING CHIP, DISPLAY DEVICE, CHIP AND TARGET SUBSTRATE

CROSS-REFERENCE TO RELATED APPLICATIONS

The present disclosure is a 371 of PCT Patent Application Serial No. PCT/CN2020/083299, filed on Apr. 3, 2020, and claims priority to Chinese Patent Application No. 201910333496.7, filed on Apr. 24, 2019 and entitled "CHIP TRANSFER METHOD, DISPLAY DEVICE, CHIP, AND TARGET SUBSTRATE", the entire content of which is incorporated herein by reference.

TECHNICAL FIELD

The present disclosure relates to a method for transferring a chip, a display device, a chip, and a target substrate.

BACKGROUND

As a novel LED chip, a micro light-emitting diode (Micro LED/μLED) chip has advantages such as high luminance, high luminous efficiency and low power consumption, and thereof has a wide application prospect in the display industry. Generally, the micro LED chip is formed on a sapphire substrate. Thus, before use, the micro LED chip needs to be transferred from a source substrate to a target substrate (such as a display backplate).

SUMMARY

The present disclosure provides a method for transferring a chip, a display device, a chip, and a target substrate. The solutions are as follows.

In a first aspect, a method for transferring a chip is provided. The method includes:
  disposing a target substrate in a sealed chamber, wherein the target substrate includes a first alignment bonding structure and a second alignment bonding structure, and the chip includes a first chip bonding structure and a second chip bonding structure;
  applying a charge of a first polarity to the first alignment bonding structure, applying a charge of a second polarity to the first chip bonding structure, and injecting an insulation fluid flowing in a first direction into the sealed chamber, such that the first chip bonding structure is aligned with the first alignment bonding structure, wherein the first polarity is different from the second polarity;
  applying the charge of the first polarity to the first alignment bonding structure, the first chip bonding structure and the second chip bonding structure respectively, applying the charge of the second polarity to the second alignment bonding structure, and changing the insulation fluid to flow in a second direction, such that the second chip bonding structure is aligned with the second alignment bonding structure, wherein the second direction is different from the first direction; and
  applying a bonding force to the chip, such that the first chip bonding structure is bonded to the first alignment bonding structure and the second chip bonding structure is bonded to the second alignment bonding structure.

In a second aspect, a display device is provided. The display device includes: a chip and a target substrate;
  wherein the chip includes a first chip bonding structure provided with a first chip engaging portion and a second chip bonding structure provided with a second chip engaging portion, and the target substrate includes a first alignment bonding structure provided with a first substrate engaging portion and a second alignment bonding structure provided with a second substrate engaging portion; and
  the first chip bonding structure is bonded to the first alignment bonding structure and the second chip bonding structure is bonded to the second alignment bonding structure, wherein the first chip engaging portion and the first substrate engaging portion are configured to be engaged to each other during a process of aligning the first chip bonding structure with the first alignment bonding structure, and the second chip engaging portion and the second substrate engaging portion are configured to be engaged to each other during a process of aligning the second chip bonding structure with the second alignment bonding structure.

In a third aspect, a chip is provided. The chip includes:
  a chip body, and a first chip bonding structure provided with a first chip engaging portion and a second chip bonding structure provided with a second chip engaging portion on the chip body;
  wherein the first chip bonding structure is configured to be bonded to a first alignment bonding structure of a target substrate, and the second chip bonding structure is configured to be bonded to a second alignment bonding structure of the target substrate, wherein the first chip engaging portion is configured to be engaged to a first substrate engaging portion of the first alignment bonding structure during a process of aligning the first chip bonding structure with the first alignment bonding structure, and the second chip engaging portion is configured to be engaged to a second substrate engaging portion of the second alignment bonding structure during a process of aligning the second chip bonding structure with a second alignment bonding structure.

In a fourth aspect, a target substrate is provided. The target substrate includes:
  a base substrate, and a first alignment bonding structure provided with a first substrate engaging portion and a second alignment bonding structure provided with a second substrate engaging portion on the base substrate;
  wherein the first alignment bonding structure is configured to be bonded to a first chip bonding structure of a chip, and the second alignment bonding structure is configured to be bonded to a second chip bonding structure of the chip, wherein the first substrate engaging portion is configured to be engaged to a first chip engaging portion of the first chip bonding structure during a process of aligning the first chip bonding structure with the first alignment bonding structure, and the second substrate engaging portion is configured to be engaged to a second chip engaging portion of the second chip bonding structure during a process of aligning the second chip bonding structure with the second alignment bonding structure.

In a fifth aspect, a method for manufacturing a chip is provided. The method includes:
  forming a chip body; and
  forming a first chip bonding structure provided with a first chip engaging portion and a second chip bonding structure provided with a second chip engaging portion on the chip body;

wherein the first chip bonding structure is configured to be bonded to a first alignment bonding structure of a target substrate, and the second chip bonding structure is configured to be bonded to a second alignment bonding structure of the target substrate, wherein the first chip engaging portion is configured to be engaged to a first substrate engaging portion of the first alignment bonding structure during a process of aligning the first chip bonding structure with the first alignment bonding structure, and the second chip engaging portion is configured to be engaged to a second substrate engaging portion of the second alignment bonding structure during a process of aligning the second chip bonding structure with a second alignment bonding structure.

In a sixth aspect, a method for manufacturing a target substrate is provided. The method includes:

forming a base substrate; and forming a first alignment bonding structure provided with a first substrate engaging portion and a second alignment bonding structure provided with a second substrate engaging portion on the base substrate;

wherein the first alignment bonding structure is configured to be bonded to a first chip bonding structure of a chip, and the second alignment bonding structure is configured to be bonded to a second chip bonding structure of the chip, wherein the first substrate engaging portion is configured to be engaged to a first chip engaging portion of the first chip bonding structure during a process of aligning the first chip bonding structure with the first alignment bonding structure, and the second substrate engaging portion is configured to be engaged to a second chip engaging portion of the second chip bonding structure during a process of aligning the second chip bonding structure with the second alignment bonding structure.

DESCRIPTION OF EMBODIMENTS

A micro LED chip is generally formed on a source substrate, and thus, before use, the micro LED chip needs to be transferred from the source substrate to a target substrate. Currently, the micro LED chip is transferred mainly by using the micro transfer printing (μTP) technology. However, in the μTP technology, the transfer efficiency is lower.

Embodiments of the present disclosure provide a method for transferring a chip, a display device, a chip, and a target substrate. Alignment between the chip and the target substrate is practiced by an insulation fluid in combination with an electrostatic force, and chips are batchwise transferred by using the microfluidic technology, which is applicable to transfer of micro LED chips. Compared with the μTP technology, the microfluidic technology facilitates improvement of chip transfer efficiency and reduces transfer cost to some extent. Detailed solutions of the present disclosure are hereinafter described in combination with the drawings.

First, the chip involved in the embodiments of the present disclosure is introduced.

Figure 1:
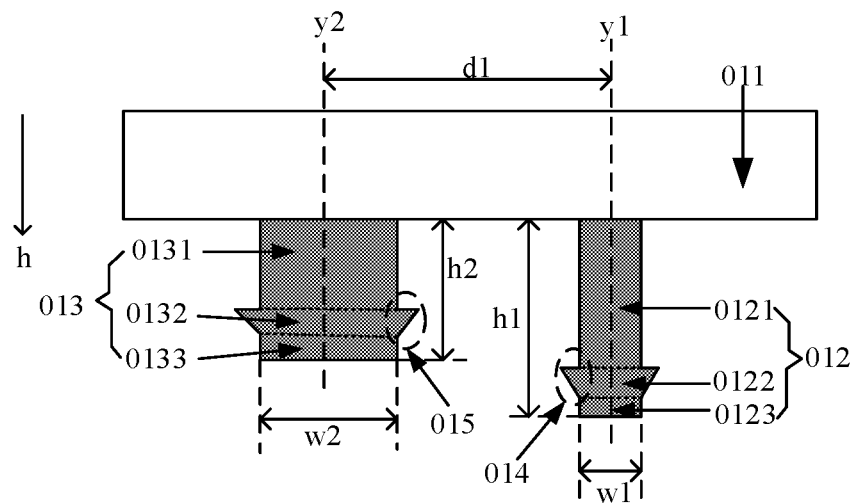
FIG. 1 is a schematic structural diagram of a chip according to an embodiment of the present disclosure.

Referring to FIG. 1, a schematic structural diagram of a chip 01 according to an embodiment of the present disclosure is illustrated. The chip 01 includes a chip body 011, and a first chip bonding structure 012 provided with a first chip engaging portion 014 and a second chip bonding structure 013 provided with a second chip engaging portion 015 on the chip body 011. The first chip bonding structure 012 is configured to be bonded to a first alignment bonding structure (not shown in FIG. 1) of a target substrate (not shown in FIG. 1), and the second chip bonding structure 013 is configured to be bonded to a second alignment bonding structure (not shown in FIG. 1) of the target substrate. The first alignment bonding structure is provided with a first substrate engaging portion (not shown in FIG. 1), and the second alignment bonding structure is provided with a second substrate engaging portion (not shown in FIG. 1). The first chip engaging portion 014 is configured to be engaged to the first substrate engaging portion during a process of aligning the first chip bonding structure 012 with the first alignment bonding structure, and the second chip engaging portion 015 is configured to be engaged to the second substrate engaging portion during a process of aligning the second chip bonding structure 013 with the second alignment bonding structure. As shown in FIG. 1, the first chip bonding structure 012 and the second chip bonding structure 013 are disposed on the same side of the chip body 011. Optionally, the first chip bonding structure 012 and the second chip bonding structure 013 may be disposed in the same layer.

Optionally, each of the first chip engaging portion 014 and the second chip engaging portion 015 may be in an annular structure, and cross sections of the first chip engaging portion 014 and the second chip engaging portion 015 may be both triangular or trapezoidal. For example, the cross section is in the shape of a right-angled triangle or a right-angled trapezoid. When the cross section of the chip engaging portion on any chip bonding structure is in the shape of the right-angled triangle or the right-angled trapezoid, one right-angle side of the right-angled triangle or the right-angled trapezoid is attached to the side surface of the chip bonding structure, the other right-angled side is perpendicular to the side surface of the chip bonding structure, and the hypotenuse is disposed on the side of the chip bonding structure distal from the chip body 011. The cross section of any chip engaging portion is parallel to the height direction h of the chip body 011. As shown in FIG. 1, the shapes of the cross sections of the first chip engaging portion 014 and the second chip engaging portion 015 are both the right-angled triangle.

Optionally, a size of the first chip bonding structure 012 is different from a size of the second chip bonding structure 013. Illustratively, a height h1 of the first chip bonding structure 012 is different from a height h2 of the second chip bonding structure 013; and a width w1 of the first chip bonding structure 012 is different from a width w2 of the second chip bonding structure 013. The height of any chip bonding structure is the size of the chip bonding structure in a direction parallel to a height direction h of the chip body 011; and the width of any chip bonding structure is the size of the chip bonding structure in a direction perpendicular to the height direction h of the chip body 011. In the embodiment of the present disclosure, the width w1 of the first chip bonding structure 012 being different from the width w2 of the second chip bonding structure 013 means that the widths of both the first chip bonding structure 012 and the second chip bonding structure 013 at the same height are different. As shown in FIG. 1, the height h1 of the first chip bonding structure 012 is greater than the height h2 of the second chip bonding structure 013, and the width w1 of the first chip bonding structure 012 is less than the width w2 of the second chip bonding structure 013.

Optionally, the first chip bonding structure 012 includes a first main pillar 0121, a first platform 0122, and a first auxiliary pillar 0123 which are sequentially stacked in a direction going away from the chip body 011. Axes of the first main pillar 0121, the first platform 0122 and the first auxiliary pillar 0123 are collinear on y1. The first platform 0122 has a first bottom surface and a second bottom surface parallel to each other. A size of the first bottom surface is greater than that of the second bottom surface. The second bottom surface of the first platform 0122, bottom surfaces of the first main pillar 0121 and bottom surfaces of the first auxiliary pillar 0123 are congruent. The first bottom surface of the first platform 0122 is stacked over one bottom surface of the first main pillar 0121. The second bottom surface of the first platform 0122 is stacked over one bottom surface of the first auxiliary pillar 0123, and a portion on the first platform 0122 protruding from the side surface of the first main pillar 0121 defines the first chip engaging portion 014. The second chip bonding structure 013 includes a second main pillar 0131, a second platform 0132, and a second auxiliary pillar 0133 which are sequentially stacked in a direction going away from the chip body 011, and axes of the second main pillar 0131, the second platform 0132, and the second auxiliary pillar 0133 are collinear on y2. The second platform 0132 has a first bottom surface and a second bottom surface parallel to each other. The size of the first bottom surface is greater than that of the second bottom surface. The second bottom surface of the second platform 0132, bottom surfaces of the second main pillar 0131, and bottom surfaces of the second auxiliary pillar 0133 are congruent. The first bottom surface of the second platform 0132 is stacked over one bottom surface of the second main pillar 0131. The second bottom surface of the second platform 0132 is stacked over one bottom surface of the second auxiliary pillar 0133, and a portion of the second platform 0132 protruding from the side surface of the second main pillar 0131 defines the second chip engaging portion 015.

Optionally, the first main pillar 0121, the first auxiliary pillar 0123, the second main pillar 0131 and the second auxiliary pillar 0133 are all cylinders, and the first platform 0122 and the second platform 0132 are both circular truncated cones. Optionally, the first main pillar 0121, the first auxiliary pillar 0123, the second main pillar 0131, and the second auxiliary pillar 0133 are all prisms, or part of the first main pillar 0121, the first auxiliary pillar 0123, the second main pillar 0131, and the second auxiliary pillar 0133 are cylinders, and the other thereof are prisms, and the first platform 0122 and the second platform 0132 are both frustums, which are not limited in the embodiment of the present disclosure.

In the embodiment of the present disclosure, the center of gravity of the chip 01 is coincided with the center of the chip 01. Optionally, the center of gravity of the chip 01 can be coincided with the center of the chip 01 by controlling the position of the chip bonding structure on the chip body 011, or by arranging a counterweight on the chip 01.

Optionally, the chip 01 may be a light-emitting chip; and the chip body 011 may include a carrier substrate, and a light-emitting unit and an encapsulation layer which are sequentially disposed on the carrier substrate. The light-emitting unit may include two laminated electrodes and a light-emitting layer disposed between the two electrodes. The two chip bonding structures are connected to the two electrodes of the light-emitting unit in a one-to-one correspondence fashion. The two chip bonding structures are configured to be bonded to the alignment bonding structures of a target substrate when the chip 01 is transferred to the target substrate. Illustratively, the two electrodes include an anode and a cathode. The first chip bonding structure 012 may be an anode bonding structure and is connected to the anode of the chip 01, the second chip bonding structure 013 may be a cathode bonding structure and is connected to the cathode of the chip 01. The first chip bonding structure 012 is configured to be bonded to the anode bonding structure of the target substrate and the second chip bonding structure 013 is configured to be bonded to the cathode bonding structure of the target substrate when the chip 01 is transferred to the target substrate. In some scenes, the anode bonding structure is also called an anode pad, and the cathode bonding structure is also called a cathode pad. Optionally, the chip 01 may be a micro LED chip, and the light-emitting unit may be a micro LED.

In the embodiment of the present disclosure, the first chip bonding structure 012 and the second chip bonding structure 013 are both made of the same or different conductive materials. Optionally, the first chip bonding structure 012 and the second chip bonding structure 013 may be both made of a metal material such as molybdenum (Mo), copper (Cu), aluminum (Al), gold (Au) and an alloy thereof. Alternatively, the first chip bonding structure 012 and the second chip bonding structure 013 are both made of a semiconductor oxide such as an indium tin oxide (ITO), an indium zinc oxide (IZO), or an aluminum-doped zinc oxide (ZnO:Al). The first chip bonding structure 012 and the second chip bonding structure 013 may be prepared by photoetching and electroplating.

Described above is the chip embodiment according to the present disclosure, and the target substrate according to the embodiment of the present disclosure is described hereinafter.

Figure 2:
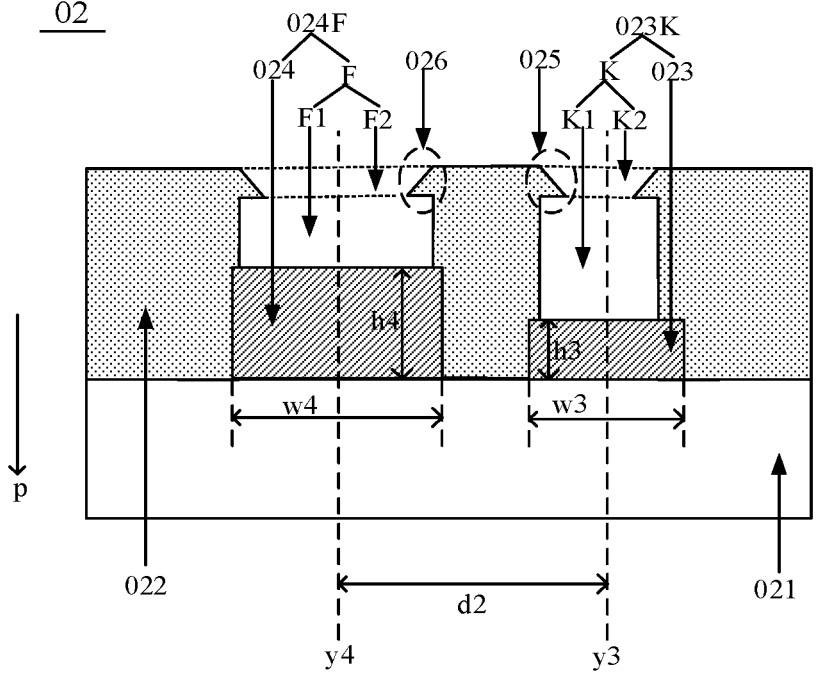
FIG. 2 is a schematic structural diagram of a target substrate according to an embodiment of the present disclosure.

Referring to FIG. 2, a schematic structural diagram of a target substrate 02 according to an embodiment of the present disclosure is illustrated. The target substrate includes a base substrate 021, and a first alignment bonding structure 023K and a second alignment bonding structure 024F which are disposed on the base substrate 021. The first alignment bonding structure 023K is provided with a first substrate engaging portion 025, and the second alignment bonding structure 024F is provided with a second substrate engaging portion 026. The first alignment bonding structure 023K is configured to be bonded to a first chip bonding structure (not shown in FIG. 2) of a chip (not shown in FIG. 2), and the second alignment bonding structure 024F is configured to be bonded to a second chip bonding structure (not shown in FIG. 2) of the chip. The first chip bonding structure is provided with a first chip engaging portion, and the second chip bonding structure is provided with a second chip engaging portion. The first substrate engaging portion 025 is configured to be engaged to the first chip engaging portion during a process of aligning the first alignment bonding structure 023K with the first chip bonding structure, and the second substrate engaging portion 026 is configured to be engaged to the second chip engaging portion during a process of aligning the second alignment bonding structure 024F with the second chip bonding structure. As shown in FIG. 1, the first alignment bonding structure 023K and the second alignment bonding structure 024F are disposed on the same side of the base substrate 021.

Optionally, the target substrate 02 includes a bonding layer (not shown in FIG. 2) and an alignment layer 022 which are stacked on the base substrate 021. The bonding layer includes a first substrate bonding structure 023 and a second substrate bonding structure 024. The alignment layer 022 is provided with a first alignment opening K and a second alignment opening F. The first alignment bonding structure 023K includes a first substrate bonding structure 023 and the first alignment opening K provided with a first substrate engaging portion 025 on a side wall thereof. The second alignment bonding structure 024F includes a second substrate bonding structure 024 and the second alignment opening F provided with a second substrate engaging portion 026 on a side wall thereof. The first substrate bonding structure 023 is configured to be bonded to the first chip bonding structure by the first alignment opening K; and the second substrate bonding structure 024 is configured to be bonded to the second chip bonding structure by the second alignment opening F.

Optionally, the first substrate bonding structure 023 is at least partially exposed through the first alignment opening K, and the second substrate bonding structure 024 is at least partially exposed through the second alignment opening F. Optionally, an orthographic projection of the first substrate bonding structure 023 on the alignment layer 022 covers the first alignment opening K, and an orthographic projection of the second substrate bonding structure 024 on the alignment layer 022 covers the second alignment opening F. In this way, it is convenient to expose both the first substrate bonding structure 023 as much as possible by the first alignment opening K, and the second substrate bonding structure 024 as much as possible by the second alignment opening F.

Optionally, each of the first substrate engaging portion 025 and the second substrate engaging portion 026 may be in an annular structure, and a cross section of each of the first substrate engaging portion 025 and the second substrate engaging portion 026 may be triangular or trapezoidal. For example, the cross section is in a shape of a right-angled triangle or a right-angled trapezoid. For the substrate engaging portion on the side wall of any alignment opening, when the cross section of the substrate engaging portion is in the shape of the right-angled triangle or the right-angled trapezoid, one right-angle side of the right-angled triangle or the right-angled trapezoid is attached to the side wall of the alignment opening, the remaining right-angled side of the right-angled triangle or the right-angled trapezoid is perpendicular to the side wall of the alignment opening, and the hypotenuse of the right-angled triangle or the right-angled trapezoid is disposed on the side of the substrate engaging portion distal from the base substrate 021. The cross section of any substrate engaging portion is parallel to the thickness direction p of the base substrate 021. As shown in FIG. 2, the cross section of each of the first substrate engaging portion 025 and the second substrate engaging portion 026 is in the shape of the right-angled triangle.

Optionally, the size of the first substrate bonding structure 023 is different from that of the second substrate bonding structure 024. Illustratively, a height h3 of the first substrate bonding structure 023 is different from a height h4 of the second substrate bonding structure 024; and a width w3 of the first substrate bonding structure 023 is different from a width w4 of the second substrate bonding structure 024. The height of any substrate bonding structure is the size of the substrate bonding structure in a direction parallel to a thickness direction p of the base substrate 021, and the width of any substrate bonding structure is the size the substrate bonding structure in a direction perpendicular to the thickness direction p of the base substrate 021. As shown in FIG. 2, the height h3 of the first substrate bonding structure 023 is less than the height h4 of the second substrate bonding structure 024, and the width w3 of the first substrate bonding structure 023 is less than the width w4 of the second substrate bonding structure 024.

Optionally, the size of the first alignment opening K is different from that of the second alignment opening F. In the embodiment of the present disclosure, the size of the first alignment opening K being different from the size of the second alignment opening F means that the widths of the first alignment opening K and the second alignment opening F at the same depth are different. As shown in FIG. 2, the size of the first alignment opening K is less than that of the second alignment opening F.

Optionally, both the first alignment opening K and the second alignment opening F are alignment holes. The end, distal from the first substrate bonding structure 023, of the first alignment opening K is a flared opening, and the end, distal from the second substrate bonding structure 024, of the second alignment opening F is a flared opening. As shown in FIG. 2, the first alignment opening K includes a first pillar-shaped through hole K1 and a first flared through hole K2 which are stacked in a direction going away from the base substrate 021. The axes of the first pillar-shaped through hole K1 and the first flared through hole K2 are collinear on y3. The smaller opening in the two openings of the first flared through hole K2 is the first opening; the first opening of the first flared through hole K2 is communicated with one opening of the first pillar-shaped through hole K1; an orthographic projection of the first opening of the first flared through hole K2 on the base substrate 021 falls within an orthographic projection of the first pillar-shaped through hole K1 on the base substrate 021; and a portion of the alignment layer 022 disposed in the first pillar-shaped through hole K1 defines the first substrate engaging portion 025. The second alignment opening F includes a second pillar-shaped through hole F1 and a second flared through hole F2 which are stacked in the direction going away from the base substrate 021. The axes of the second pillar-shaped through hole F1 and the second flared through hole F2 are collinear on y4. The smaller opening in the two openings of the second flared through hole F2 is the first opening; the first opening of the second flared through hole F2 is communicated with one opening of the second pillar-shaped through hole F1; an orthographic projection of the first opening of the second flared through hole F2 on the base substrate 021 falls within an orthographic projection of the second pillar-shaped through hole F1 on the base substrate 021; and a portion of the alignment layer 022 disposed in the second pillar-shaped through hole F1 defines the second substrate engaging portion 026.

Optionally, both the first pillar-shaped through hole K1 and the second pillar-shaped through hole F1 may be cylindrical through holes; and the openings of the first flared through hole K2 and the second flared through hole F2 are both *circulars*. Optionally, the first pillar-shaped through hole K1 and the second pillar-shaped through hole F1 may also be through holes of other shapes, and the openings of both the first flared through hole K2 and the second flared through hole F2 may also be in shapes of other polygons, which are not limited in the embodiment of the present disclosure.

Optionally, the base substrate 021 includes two electrodes which are connected to the two substrate bonding structures in a one-to-one correspondence fashion, and the two substrate bonding structures are configured to be bonded to the chip bonding structures when the chip is transferred to the target substrate 02. Illustratively, the two electrodes include an anode and a cathode. The first substrate bonding structure 023 may be an anode bonding structure and is connected to the anode of the base substrate 021, and the second substrate bonding structure 024 may be a cathode bonding structure and is connected to the cathode of the base substrate 021. The first substrate bonding structure 023 is configured to be bonded to the anode bonding structure of the chip and the second substrate bonding structure 024 is configured to be bonded to the cathode bonding structure of the chip when the chip is transferred to the target substrate 02. In some scenes, the anode bonding structure is also called an anode pad, and the cathode bonding structure is also called a cathode pad.

Figure 3:
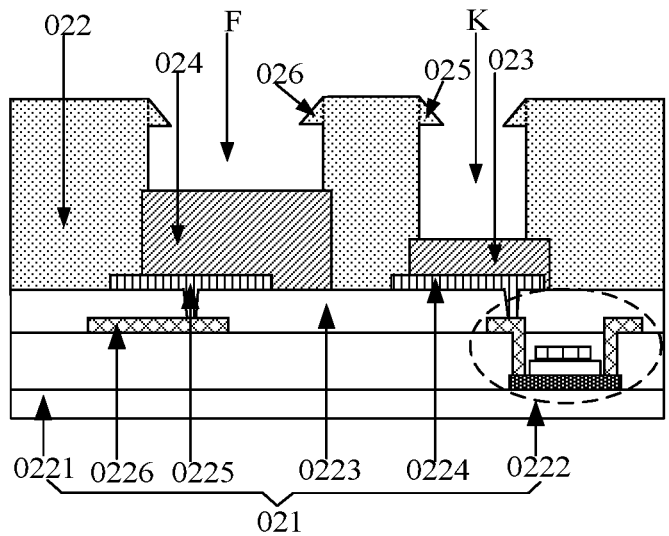
FIG. 3 is a schematic structural diagram of another target substrate according to an embodiment of the present disclosure.

Optionally, the base substrate 021 may be a display backplate. Referring to FIG. 3, FIG. 3 is a schematic structural diagram of another target substrate 02 according to an embodiment of the present disclosure. The base substrate 021 includes a glass substrate (or a rigid or flexible substrate) 0221, and a thin film transistor (TFT) 0222, a planarization layer (PLN) 0223 and an electrode layer which are sequentially disposed on the glass substrate. The electrode layer includes an anode 0224 and a cathode 0225. The TFT 0222 includes a gate electrode, a gate insulating layer, an active layer, an interlayer dielectric layer, a source electrode and a drain electrode. The base substrate 021 further includes a data line and a cathode trace 0226. The data line and the cathode trace 0226 are disposed on the same layer as a source-drain electrode layer. The data line is connected to the source electrode; the planarization layer 0223 is provided with an anode via hole and a cathode via hole. The anode 0224 is connected to the drain electrode through the anode via hole; and the cathode 0225 is connected to the cathode trace 0226 through the cathode via hole. The first substrate bonding structure 023 is connected to the anode 0224, and the second substrate bonding structure 024 is connected to the cathode 0225.

Optionally, the first substrate bonding structure 023 and the second substrate bonding structure 024 are both made of the same or different conductive materials. Optionally, both the first substrate bonding structure 023 and the second substrate bonding structure 024 may be made of a metal material such as Mo, Cu, Al, Au and an alloy thereof; or both the first substrate bonding structure 023 and the second substrate bonding structure 024 may be made of a semiconductor oxide such as ITO, IZO, or ZnO:Al. The alignment layer 022 may be made of an organic insulating material such as an organic resin. The first substrate bonding structure 023, the second substrate bonding structure 024, and the alignment layer 022 may be all prepared by photoetching.

Described above are examples of the target substrate according to the embodiment of the present disclosure, and the method for transferring a chip according to the embodiment of the present disclosure are described below. According to the embodiment of the present disclosure, the method for transferring the chip is capable of transferring the chip 01 shown in FIG. 1 from a source substrate to the target substrate 02 shown in FIG. 2 or FIG. 3. Referring to FIGS. 1 to 3, the maximum width of the first chip bonding structure 012 is less than the maximum size of the first alignment opening K and greater than the minimum size of the first alignment opening K; and the maximum width of the second chip bonding structure 013 is less than the maximum size of the second alignment opening F and greater than the minimum size of the second alignment opening F. The width of the end of the second chip bonding structure 013 distal from the chip body 011 is greater than the opening size of the end of the first alignment opening K distal from the first substrate bonding structure 012. The distance d1 between the first chip bonding structure 012 and the second chip bonding structure 013 is equal to the distance d2 between the first alignment opening K and the second alignment opening F. The sum of the height h1 of the first chip bonding structure 012 and the height h3 of the first substrate bonding structure 023 is equal to the sum of the height h2 of the second chip bonding structure 013 and the height h4 of the second substrate bonding structure 024. The maximum width of the first chip bonding structure 012 is the width of the first chip bonding structure 012 at the first chip engaging portion 014, i.e., is the width (for example, the diameter) of the first bottom surface of the first platform 0122 of the first chip bonding structure 012. The maximum width of the second chip bonding structure 013 is the width of the second chip bonding structure 013 at the second chip engaging portion 015, i.e., is the width (for example, the diameter) of the first bottom surface of the second platform 0132 of the second chip bonding structure 013. The width of the end of the second chip bonding structure 013 distal from the chip body 011 is the width (for example, the diameter) of the bottom surface of the second auxiliary pillar 0133 of the second chip bonding structure 013. Both the first alignment opening K and the second alignment opening F may be alignment holes. The maximum size of the first alignment opening K is the aperture of the first pillar-shaped through hole K1, and the minimum size of the first alignment opening K is the size of the first alignment opening K at the first substrate engaging portion 015, i.e., is the size (for example, the diameter) of the first opening of the first flared through hole K2. The opening at the end of the first alignment opening K distal from the first substrate bonding structure 012 is the second opening of the first flared through hole K2; the maximum size of the second alignment opening F is the aperture of the second pillar-shaped through hole F1. The minimum size of the second alignment opening F is the size of the second alignment opening F at the second substrate engaging portion 026, i.e., is the size (for example, the diameter) of the first opening of the second flared opening F2.

Figure 4:
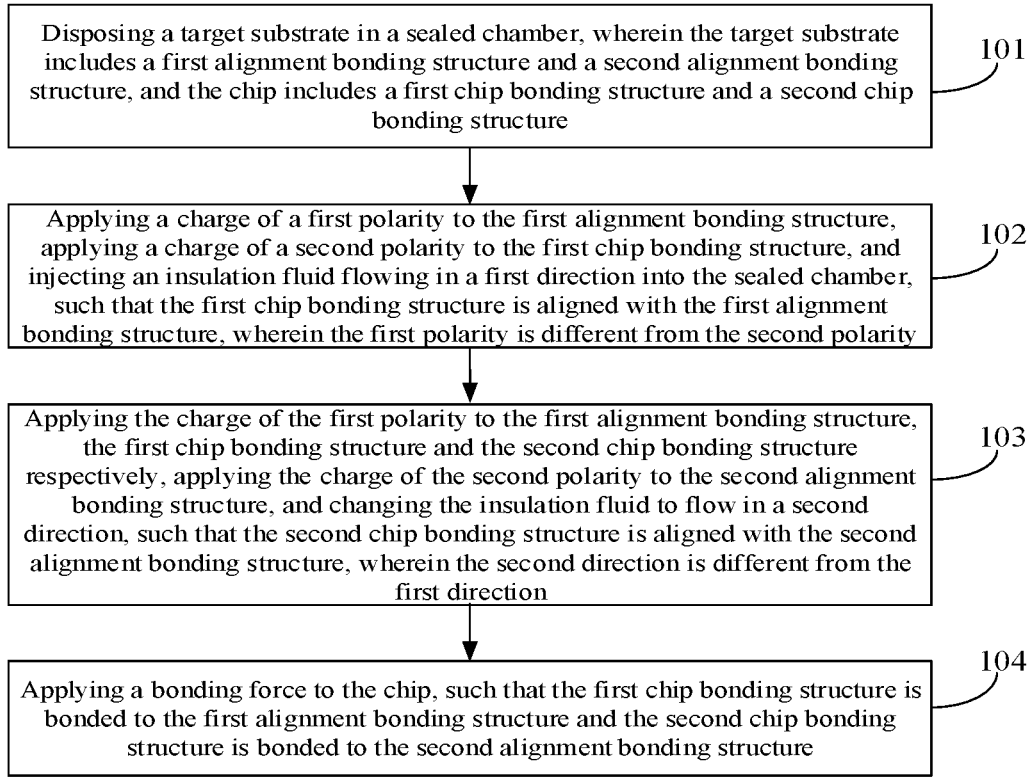
FIG. 4 is a flowchart of a method for transferring a chip according to an embodiment of the present disclosure.

Referring to FIG. 4, a flowchart showing a method for transferring a chip according to an embodiment of the present disclosure is illustrated. The method is employed to transfer a chip from a source substrate to a target substrate, and includes the following steps.

In step 101, the target substrate is disposed in a sealed chamber, wherein the target substrate includes a first alignment bonding structure and a second alignment bonding structure, and the chip includes a first chip bonding structure and a second chip bonding structure.

In step 102, a charge of a first polarity is applied to the first alignment bonding structure, a charge of a second polarity is applied to the first chip bonding structure, and an insulation fluid flowing in a first direction is injected into the sealed chamber, such that the first chip bonding structure is aligned with the first alignment bonding structure, wherein the first polarity is different from the second polarity.

In step 103, the charge of the first polarity is applied to the first alignment bonding structure, the first chip bonding structure and the second chip bonding structure, respectively, the charge of the second polarity is applied to the second alignment bonding structure, and the insulation fluid is changed to flow in a second direction, such that the second chip bonding structure is aligned with the second alignment bonding structure, wherein the second direction is different from the first direction.

In step 104, a bonding force is applied to the chip, such that the first chip bonding structure is bonded to the first alignment bonding structure, and the second chip bonding structure is bonded to the second alignment bonding structure.

In summary, in the method for transferring the chip according to the embodiments of the present disclosure, the chip is aligned with the target substrate by the insulation fluid in combination with the electrostatic force, which realizes batchwise transfer of the chips, and thus facilitates improvement of the chip transfer efficiency.

Figure 5:
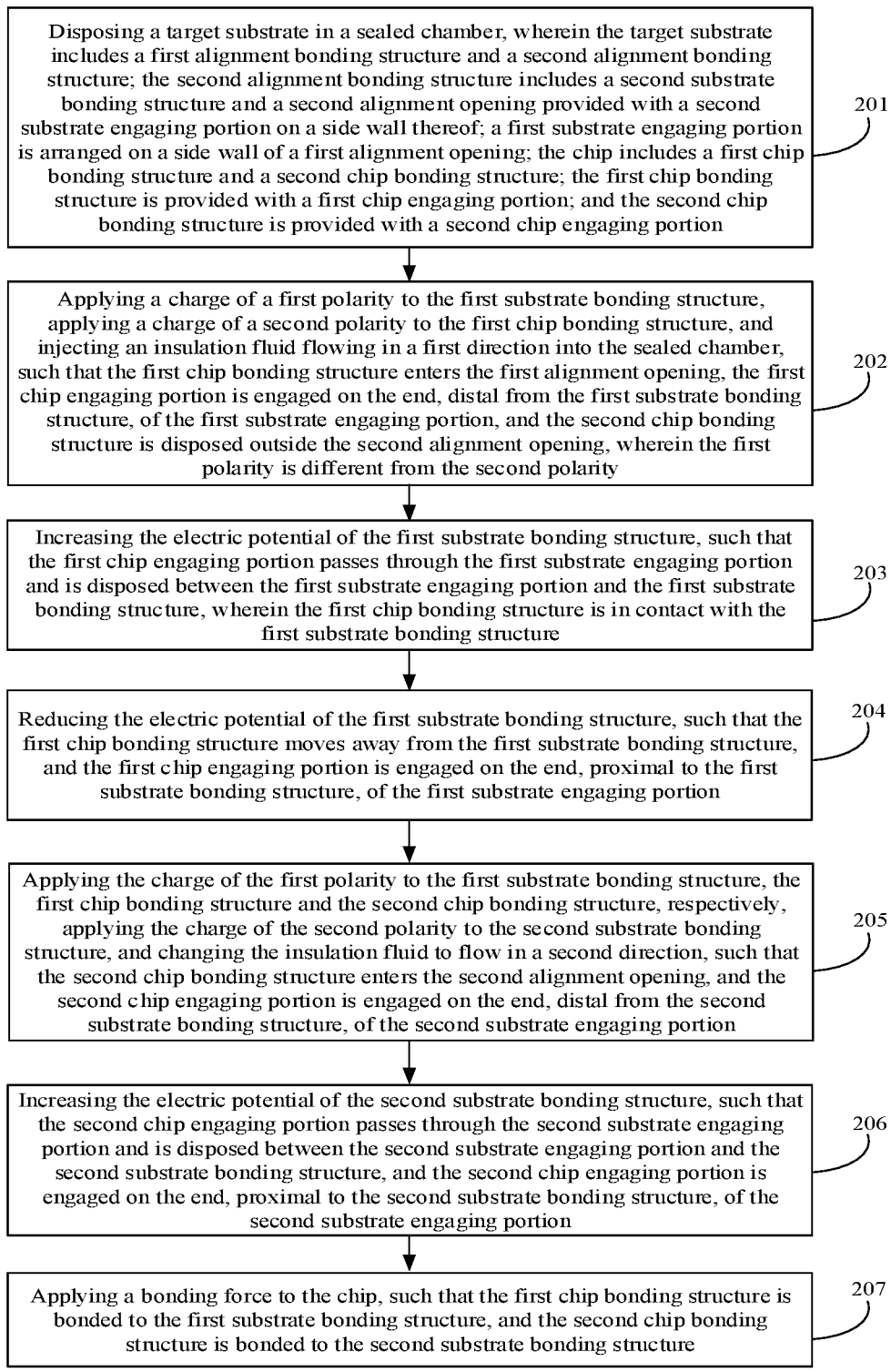
FIG. 5 is a flowchart of another method for transferring a chip according to an embodiment of the present disclosure.

Referring to FIG. 5, a flowchart showing another method for transferring a chip according to an embodiment of the present disclosure is illustrated. The method is described by taking an example in which the chip 01 shown in FIG. 1 is transferred to the target substrate 02 shown in FIG. 2. Referring to FIG. 5, the method may include the following steps.

In step 201, a target substrate is disposed in a sealed chamber, wherein the target substrate includes a first alignment bonding structure and a second alignment bonding structure; the first alignment bonding structure includes a first substrate bonding structure and a first alignment opening provided with a first substrate engaging portion on a side wall thereof, the second alignment bonding structure includes a second substrate bonding structure and a second alignment opening provided with a second substrate engaging portion on a side wall thereof; the chip includes a first chip bonding structure and a second chip bonding structure; the first chip bonding structure is provided with a first chip engaging portion; and the second chip bonding structure is provided with a second chip engaging portion.

Optionally, a support frame is disposed inside the sealed chamber, and the target substrate is placed on the support frame. Illustratively, as shown in FIG. 2, the target substrate 02 includes the first alignment bonding structure 023K and the second alignment bonding structure 024F; and the target substrate 02 includes a bonding layer and an alignment layer 022 which are laminated. The bonding layer includes the first substrate bonding structure 023 and the second substrate bonding structure 024. The alignment layer 022 is provided with the first alignment opening K and the second alignment opening F. The first alignment bonding structure 023K includes the first substrate bonding structure 023 and the first alignment opening K provided with a first substrate engaging portion 025 on the side wall thereof. The second alignment bonding structure 024F includes the second substrate bonding structure 024 and the second alignment opening F provided with a second substrate engaging portion 026 on the side wall thereof. As shown in FIG. 1, the chip 01 includes the first chip bonding structure 012 and the second chip bonding structure 013. The first chip bonding structure 012 is provided with the first chip engaging portion 014, and the second chip bonding structure 013 is provided with the second chip engaging portion 015.

In step 202, a charge of a first polarity is applied to the first substrate bonding structure, a charge of a second polarity is applied to the first chip bonding structure, an insulation fluid flowing in a first direction is injected into the sealed chamber, such that the first chip bonding structure enters the first alignment opening, the first chip engaging portion is engaged on the end, distal from the first substrate bonding structure, of the first substrate engaging portion, and the second chip bonding structure is disposed outside the second alignment opening, wherein the first polarity is different from the second polarity.

Optionally, the target substrate is provided with a trace connected to the first substrate bonding structure. The charge of the first polarity may be applied to the first substrate bonding structure through the trace. After the charge of the first polarity is applied to the first substrate bonding structure, an electric potential of the first substrate bonding structure may be a first electric potential. Illustratively, the charge of the first polarity may be applied to the first substrate bonding structure 023 through a data line. Optionally, the second substrate bonding structure may be grounded while the charge of the first polarity is applied to the first substrate bonding structure, such that an electric potential of the second substrate bonding structure may be zero electric potential. Alternatively, the charge of the first polarity may also be applied to the second substrate bonding structure, which is not limited in the embodiment of the present disclosure.

Optionally, the charge of the second polarity may be applied to the first chip bonding structure by triboelectrification. The charge of the second polarity may also be applied to the second chip bonding structure while being applied to the first chip bonding structure. Alternatively, no charge is applied to the second chip bonding structure, which is not limited in the embodiment of the present disclosure. The first polarity is different from the second polarity. Illustratively, the first polarity may be positive, and the second polarity may be negative.

Optionally, the first direction may point from the second alignment opening of the target substrate to the first alignment opening. The sealed chamber may be provided with a first fluid port and a second fluid port opposite to each other. After the target substrate is disposed in the sealed chamber, the first alignment opening and the second alignment opening may be disposed in an extending direction along a connecting line of the first fluid port and the second fluid port. The first alignment opening is close to the first fluid port, and the second alignment opening is close to the second fluid port. The insulation fluid may be injected into the sealed chamber by the second fluid port; and the insulation fluid may be drawn out from the sealed chamber by the first fluid port, such that the insulation fluid flowing in the first direction is injected into the sealed chamber.

After the insulation fluid is injected into the sealed chamber, the chip may be suspended in the insulation fluid in the sealed chamber; and then the electric potential of the first substrate bonding structure is kept at the first electric potential by controlling the charge of the first substrate bonding structure. Under the acting force of the insulation fluid and the attraction force between the first chip bonding structure and the first substrate bonding structure, the first chip bonding structure moves close to the first substrate bonding structure to drive the chip to move close to the target substrate. The end, distal from the chip body, of the first chip bonding structure enters the first alignment opening; the first chip engaging portion is engaged on the end, distal from the first substrate bonding structure, of the first substrate engaging portion; the second chip bonding structure is disposed outside the second alignment opening; and the second chip bonding structure is disposed on one side, distal from the second alignment opening, of the first alignment opening. The first chip bonding structure is in a semi-fixed state.

Figure 6:
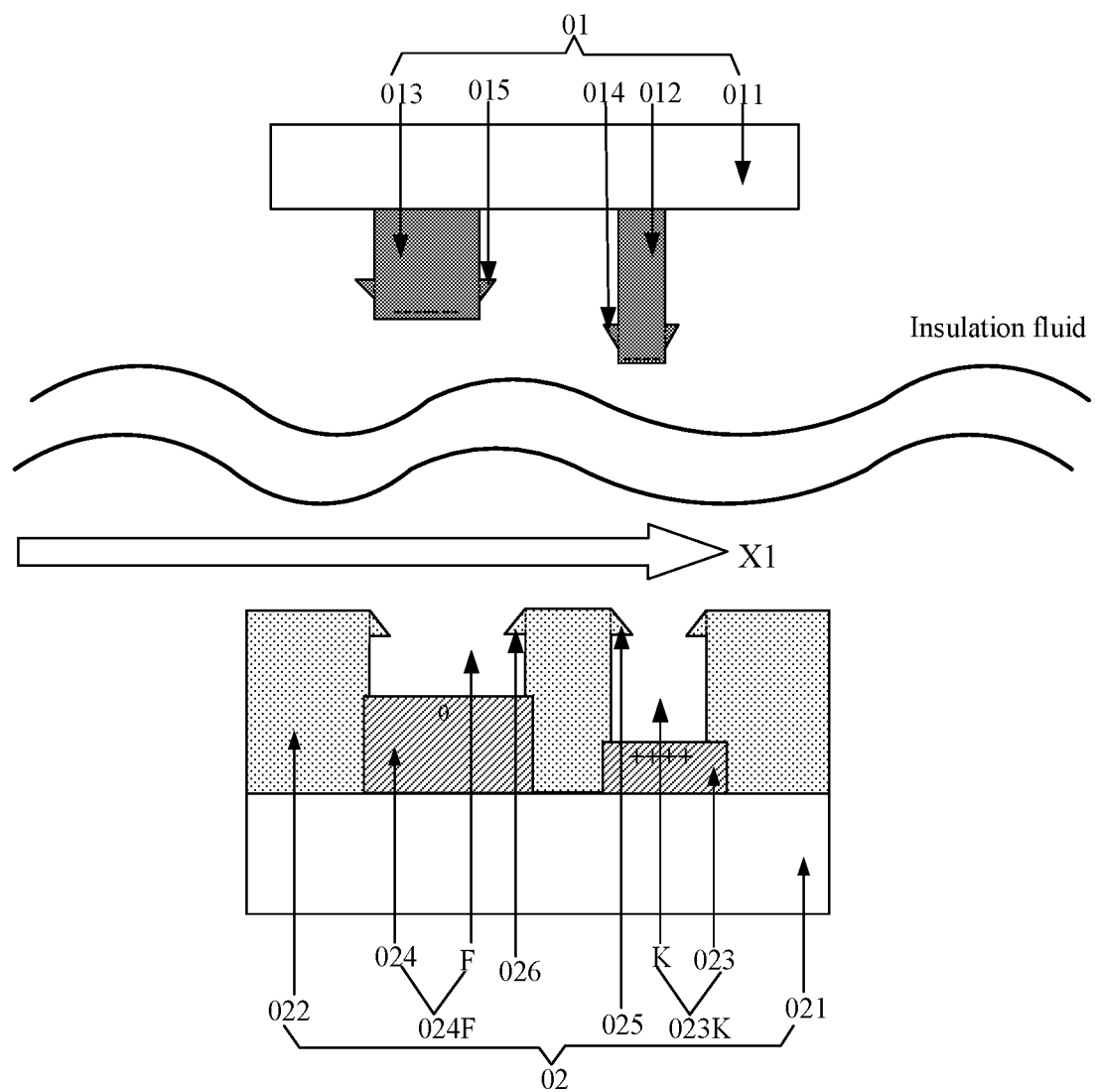
FIGS. 6 to 15 are schematic diagrams of chip transfer processes according to embodiments of the present disclosure.
Figure 7:
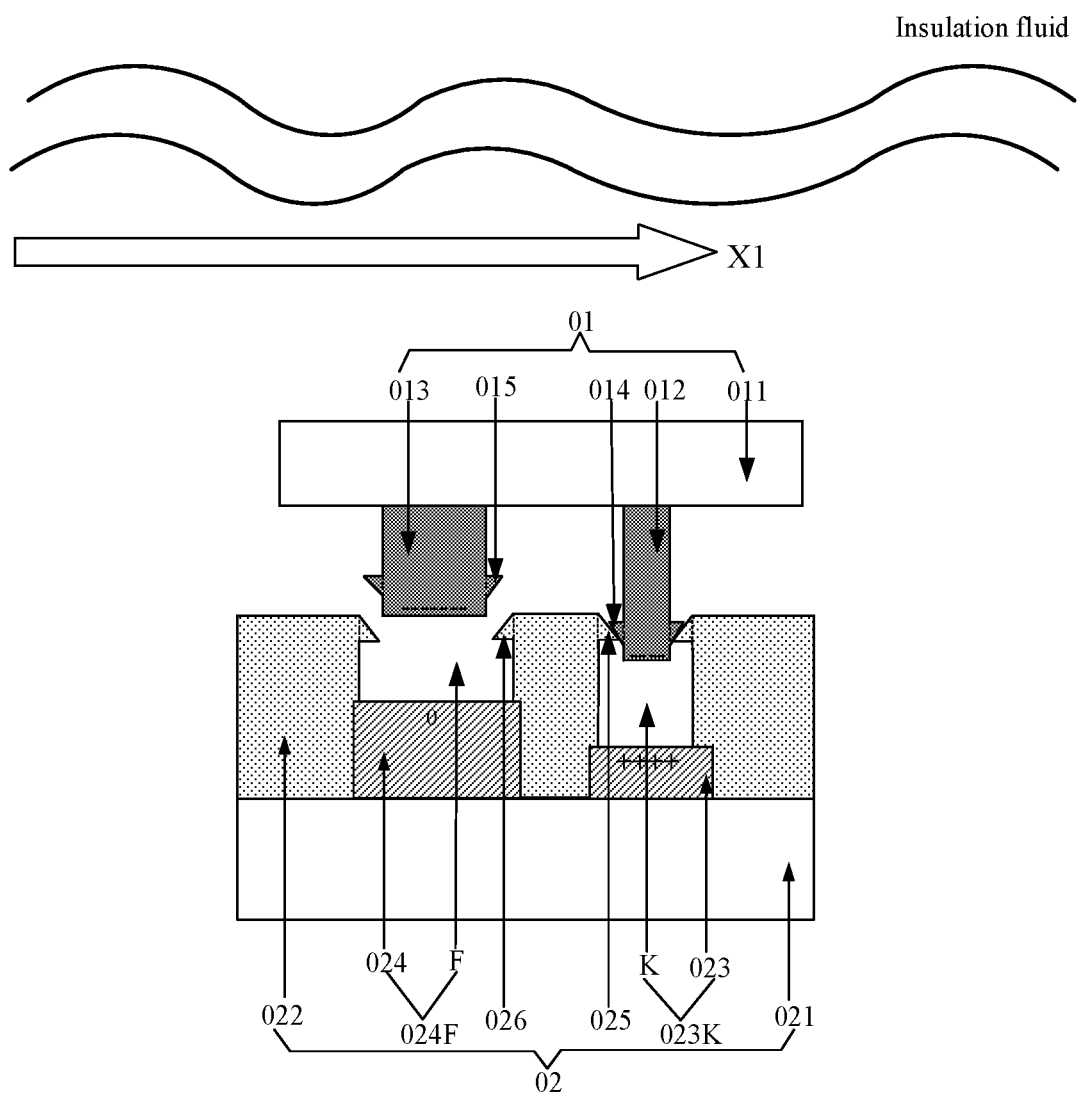
Figure 8:
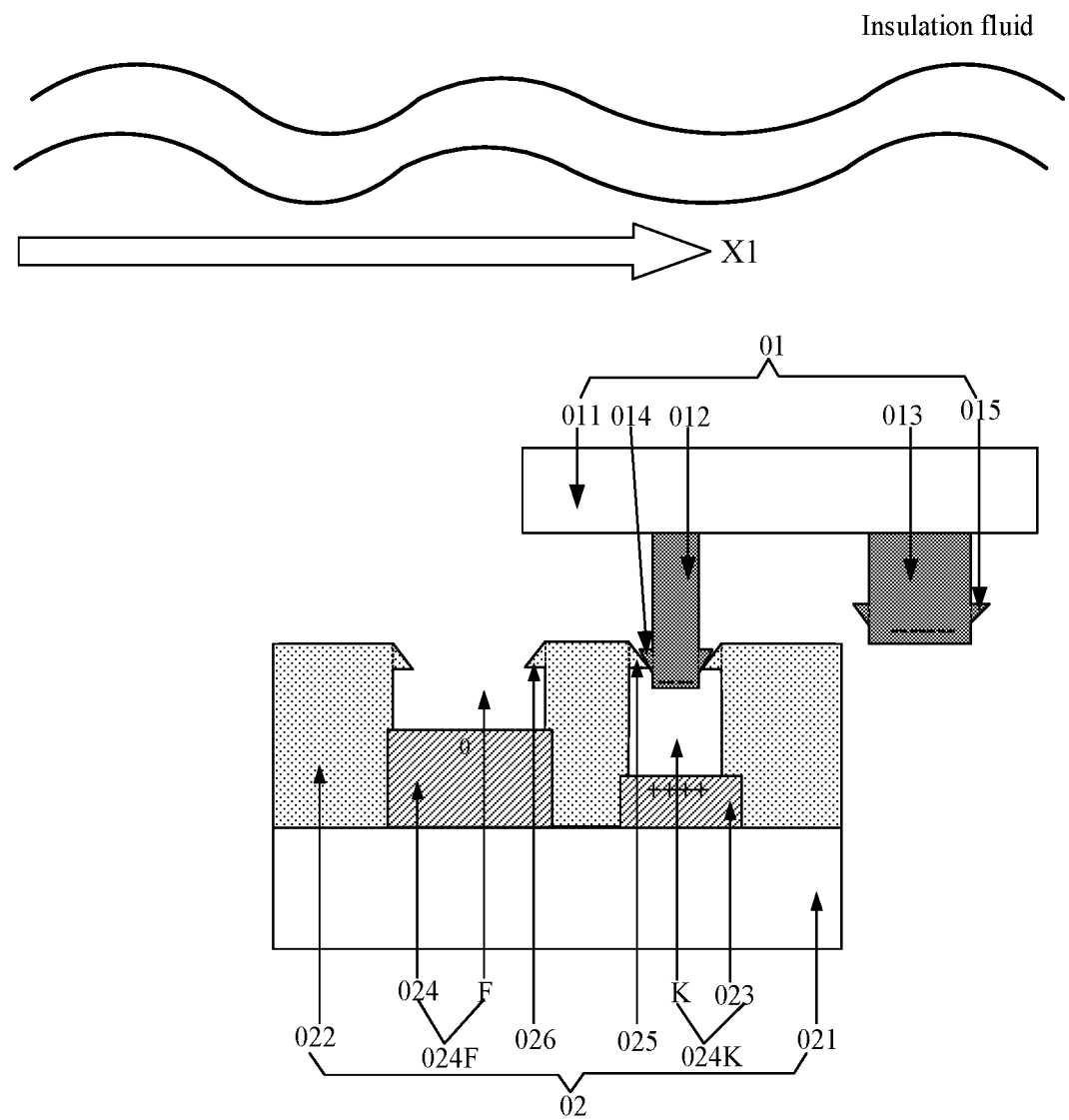
Figure 9:
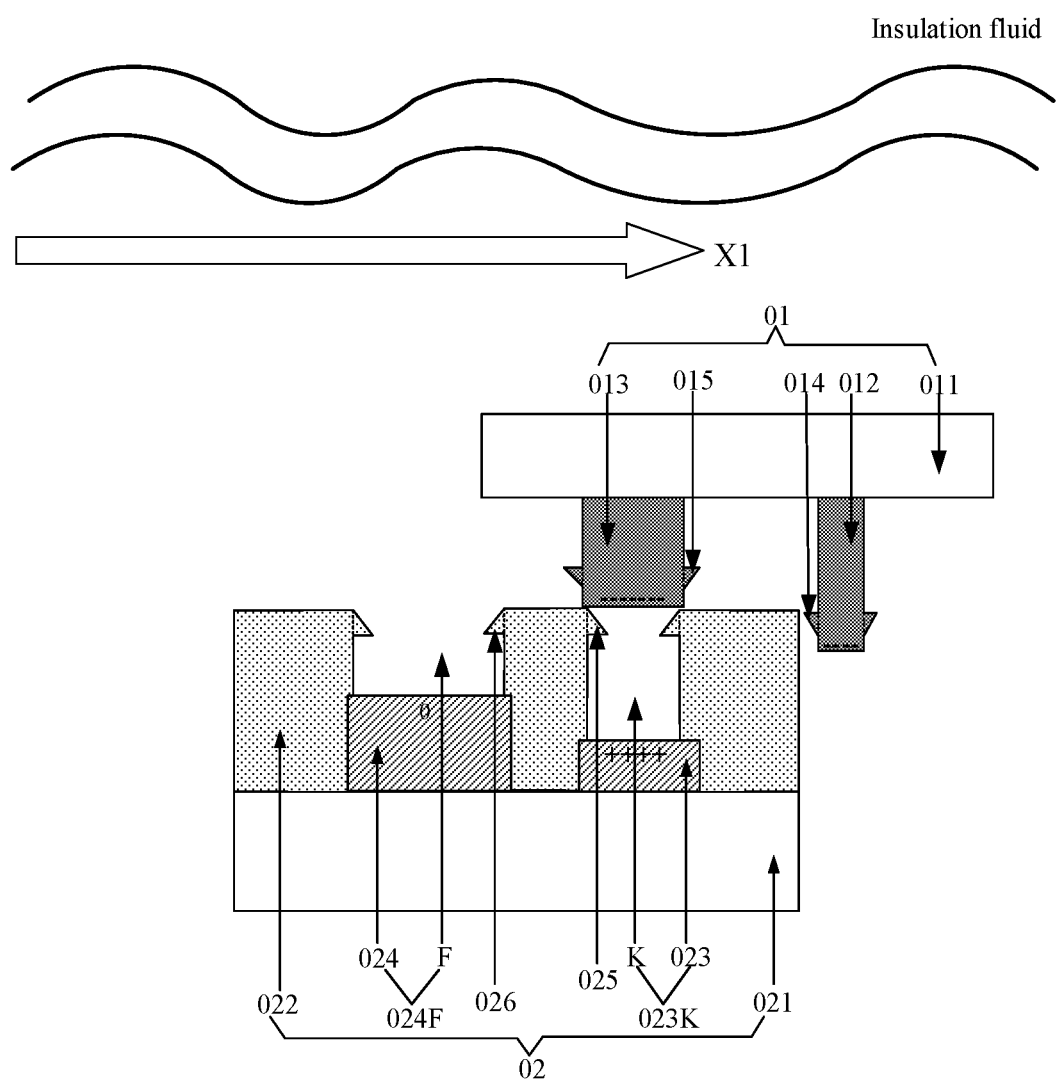

Illustratively, referring to FIG. 6, a negative charge is applied to the first chip bonding structure 012 and the second chip bonding structure 013, a positive charge is applied to the first substrate bonding structure 023 to enable the electric potential of the first substrate bonding structure 023 to be the first electric potential, and the second substrate bonding structure 024 is grounded. The insulation fluid in the sealed chamber (not shown in FIG. 6) flows in the first direction X1, the chip 01 is suspended in the insulation fluid in the sealed chamber, and the electric potential of the first substrate bonding structure 023 is kept at the first electric potential. Under the acting force of the insulation fluid and the attraction force between the first chip bonding structure 012 and the first substrate bonding structure 023, the first chip bonding structure 012 moves close to the first substrate bonding structure 023 to drive the chip 01 to move close to the target substrate 02. Then, as shown in FIG. 7, the end, distal from the chip body 011, of the first chip bonding structure 012 enters the first alignment opening K, the first chip engaging portion 014 is engaged on the end, distal from the first substrate bonding structure 023, of the first substrate engaging portion 025, and the first chip bonding structure 012 is in a semi-fixed state. Then, as shown in FIG. 8, the insulation fluid flowing in the first direction X1 is continuously injected into the sealed chamber, such that the chip 01 rotates around the first chip bonding structure 012, and the second chip bonding structure 013 moves to the side, distal from the second alignment opening F, of the first alignment opening K. In the embodiment of the present disclosure, as the width of the end of the second chip bonding structure 013 distal from the chip body 011 is greater than the opening size of the end of the first alignment opening K distal from the first substrate bonding structure 012, as shown in FIG. 9, the second chip bonding structure 013 cannot enter the first alignment opening K. For the state shown in FIG. 9, the chip 01 continues to flow along with the insulation fluid until it reaches the state shown in FIG. 8.

Optionally, the chip can be first disposed in the sealed chamber, and then, the insulation fluid is injected into the sealed chamber. With the effect of the insulation fluid, the chip is suspended in the insulation fluid in the sealed chamber. Alternatively, the chip and the insulation fluid may be mixed first, and then, the insulation fluid mixed with the chip is injected into the sealed chamber, such that the chip is suspended in the insulation fluid in the sealed chamber. The chip may be grown on a sacrificial layer of the source substrate, and the sacrificial layer may be etched to separate the chip from the source substrate before the chip is disposed in the sealed chamber.

In step 203, the electric potential of the first substrate bonding structure is increased, such that the first chip engaging portion passes through the first substrate engaging portion and is disposed between the first substrate engaging portion and the first substrate bonding structure, and the first chip bonding structure is in contact with the first substrate bonding structure.

Optionally, the insulation fluid in the sealed chamber is kept flowing in the first direction, and the electric potential of the first substrate bonding structure is increased from the first electric potential to a second electric potential by controlling the charge on the first substrate bonding structure, such that the attraction force between the first chip bonding structure and the first substrate bonding structure is increased. Under the acting force of the insulation fluid and the attraction force between the first chip bonding structure and the first substrate bonding structure, the first chip bonding structure continues to move close to the first substrate bonding structure, such that the first chip engaging portion passes through the first substrate engaging portion to be located between the first substrate engaging portion and the first substrate bonding structure, and the first chip bonding structure is in contact with the first substrate bonding structure. After that, the charge of the first polarity on the first substrate bonding structure is conducted to the first chip bonding structure, and then is conducted to the second chip bonding structure through the first chip bonding structure. The first substrate bonding structure, the first chip bonding structure, and the second chip bonding structure all carry the charge of the first polarity.

Figure 10:
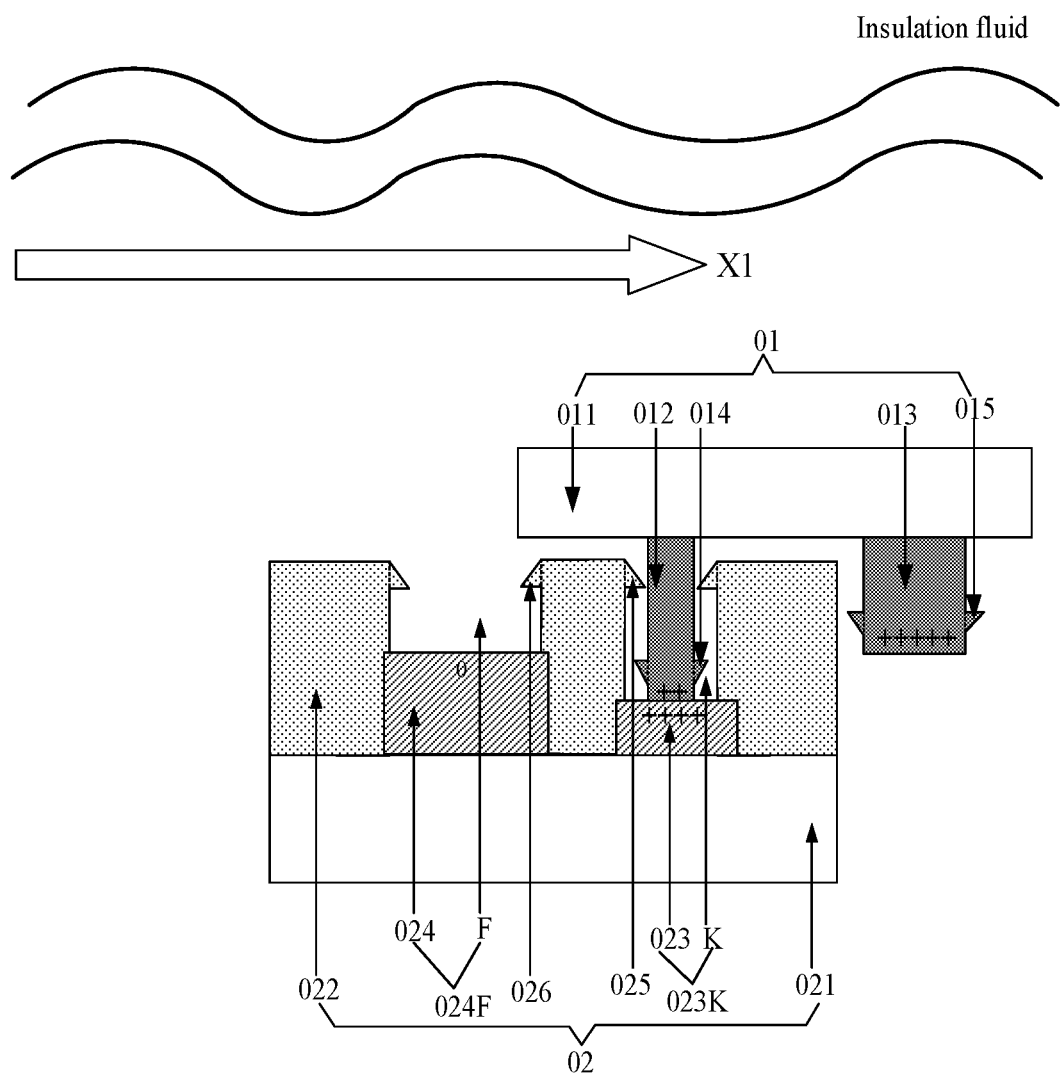

Illustratively, referring to FIG. 10, the insulation fluid in the sealed chamber is kept flowing in the first direction X1, and the electric potential of the first substrate bonding structure 023 is increased from the first electric potential to the second electric potential. Under the acting force of the insulation fluid and the attraction force between the first chip bonding structure 012 and the first substrate bonding structure 023, the first chip engaging portion 014 passes through the first substrate engaging portion 025, such that the first chip bonding structure 012 is in contact with the first substrate bonding structure 023. The first substrate bonding structure 023, the first chip bonding structure 012 and the second chip bonding structure 013 all carry the positive charge due to charge conduction.

In step 204, the electric potential of the first substrate bonding structure is reduced, such that the first chip bonding structure moves away from the first substrate bonding structure, and the first chip engaging portion is engaged on the end, proximal to the first substrate bonding structure, of the first substrate engaging portion.

Figure 11:
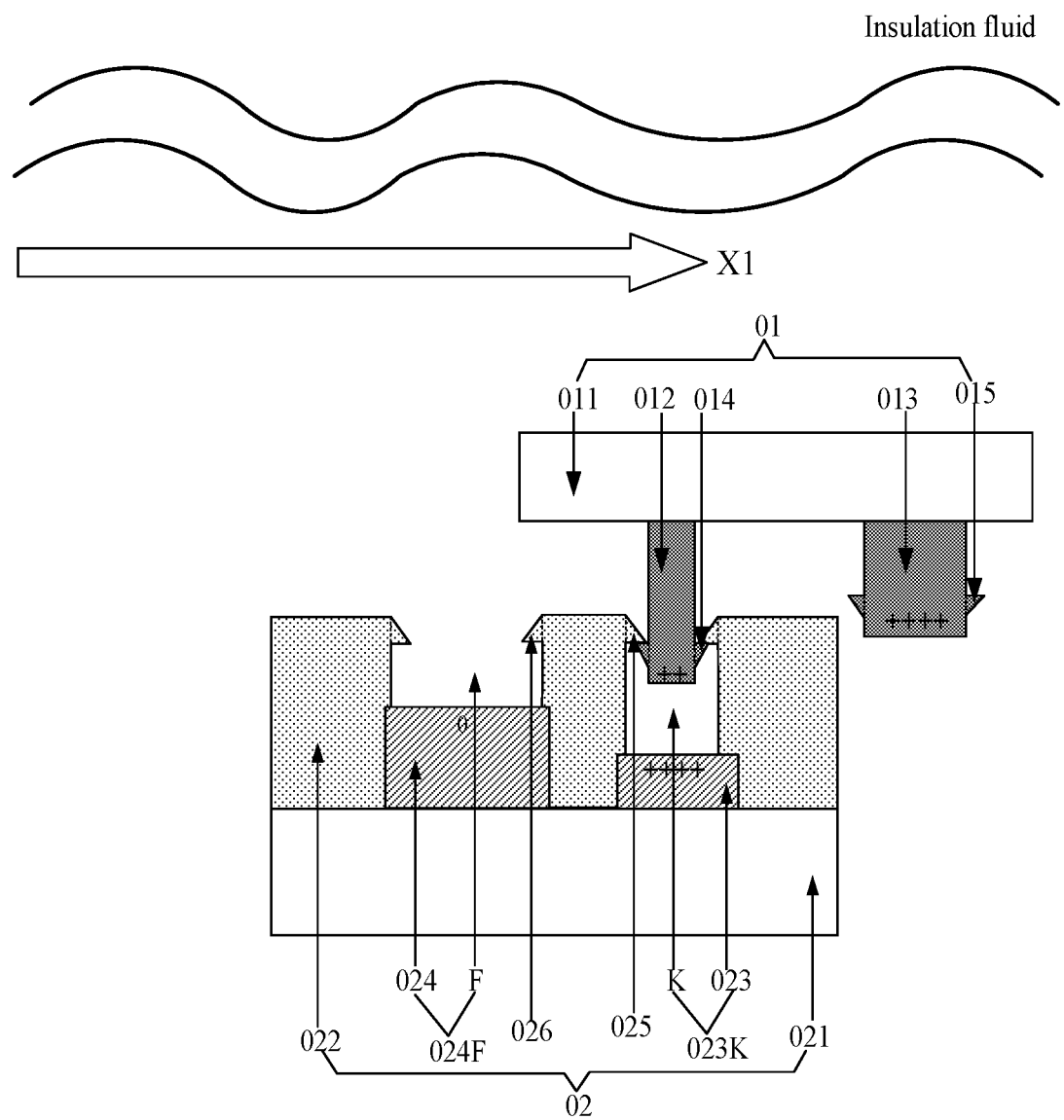

Optionally, the insulation fluid in the sealed chamber is kept flowing in the first direction, and the electric potential of the first substrate bonding structure is reduced from the second electric potential to a third electric potential by controlling charge on the first substrate bonding structure, such that a repulsive force between the first chip bonding structure and the first substrate bonding structure is increased. Under the acting force of the insulation fluid and the repulsive force between the first chip bonding structure and the first substrate bonding structure, the first chip bonding structure moves away from the first substrate bonding structure, and the first chip engaging portion is engaged on the end, proximal to the first substrate bonding structure of the first substrate engaging portion, Illustratively, referring to FIG. 11, the insulation fluid in the sealed chamber is kept flowing in the first direction X1, and the electric potential of the first substrate bonding structure 023 is reduced from the second electric potential to the third electric potential. Under the acting force of the insulation fluid and the repulsive force between the first chip bonding structure 012 and the first substrate bonding structure 023, the first chip bonding structure 012 moves away from the first substrate bonding structure 023, and the first chip engaging portion 014 is engaged on the end, proximal to the first substrate bonding structure 023, of the first substrate engaging portion 025.

In step 205, the charge of the first polarity is applied to the first substrate bonding structure, the first chip bonding structure and the second chip bonding structure, respectively, the charge of the second polarity is applied to the second substrate bonding structure, and the insulation fluid is changed to flow in a second direction, such that the second chip bonding structure enters the second alignment opening, and the second chip engaging portion is engaged on the end, distal from the second substrate bonding structure, of the second substrate engaging portion.

Optionally, the charge of the first polarity may be applied to the first chip bonding structure and the second chip bonding structure respectively by triboelectrification. The target substrate is provided with a trace connected to the second substrate bonding structure. The charge of the second polarity may be applied to the second substrate bonding structure through the trace. After the charge of the second polarity is applied to the second substrate bonding structure, an electric potential of the second substrate bonding structure may be a fourth electric potential. Illustratively, the charge of the second polarity may be applied to the second substrate bonding structure 024 through a cathode trace. It can be understood that after step 204, the second chip bonding structure has already carried the charge of the first polarity. In step 205, the charge of the first polarity may be applied to the second chip bonding structure based on step 204; or because the second chip bonding structure has already carried the charge of the first polarity after step 204, the charge of the first polarity may not be applied to the second chip bonding structure in step 205.

Optionally, the second direction may be opposite to the first direction. The insulation fluid may be injected into the sealed chamber through the first fluid port, and may be drawn out from the sealed chamber through the second fluid port, such that the insulation fluid in the sealed chamber flows in the second direction, thereby changing the insulation fluid to flow in the second direction. In this process, the electric potential of the second substrate bonding structure is kept at the fourth electric potential by controlling charge of the second substrate bonding structure. Under the acting force of the insulation fluid, and the repulsive force between the first chip bonding structure and the first substrate bonding structure and the attraction force between the second chip bonding structure and the second substrate bonding structure, the chip rotates around the first chip bonding structure, such that the second chip bonding structure moves close to the second substrate bonding structure, the end, distal from the chip body, of the second chip bonding structure enters the second alignment opening, the second chip engaging portion is engaged on the end, distal from the second substrate bonding structure, of the second substrate engaging portion, and the second chip bonding structure is in a semi-fixed state.

Figure 12:
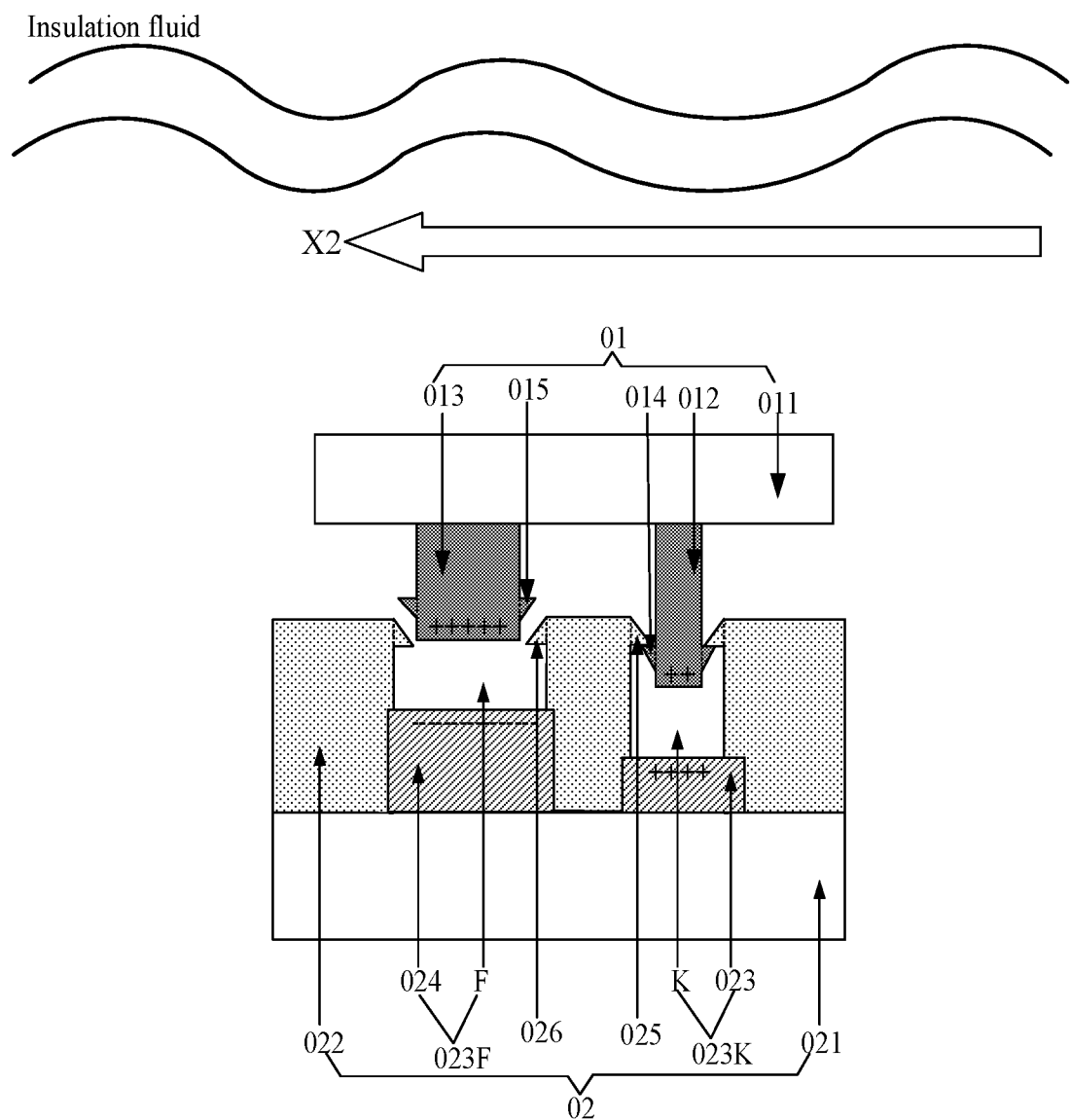
Figure 13:
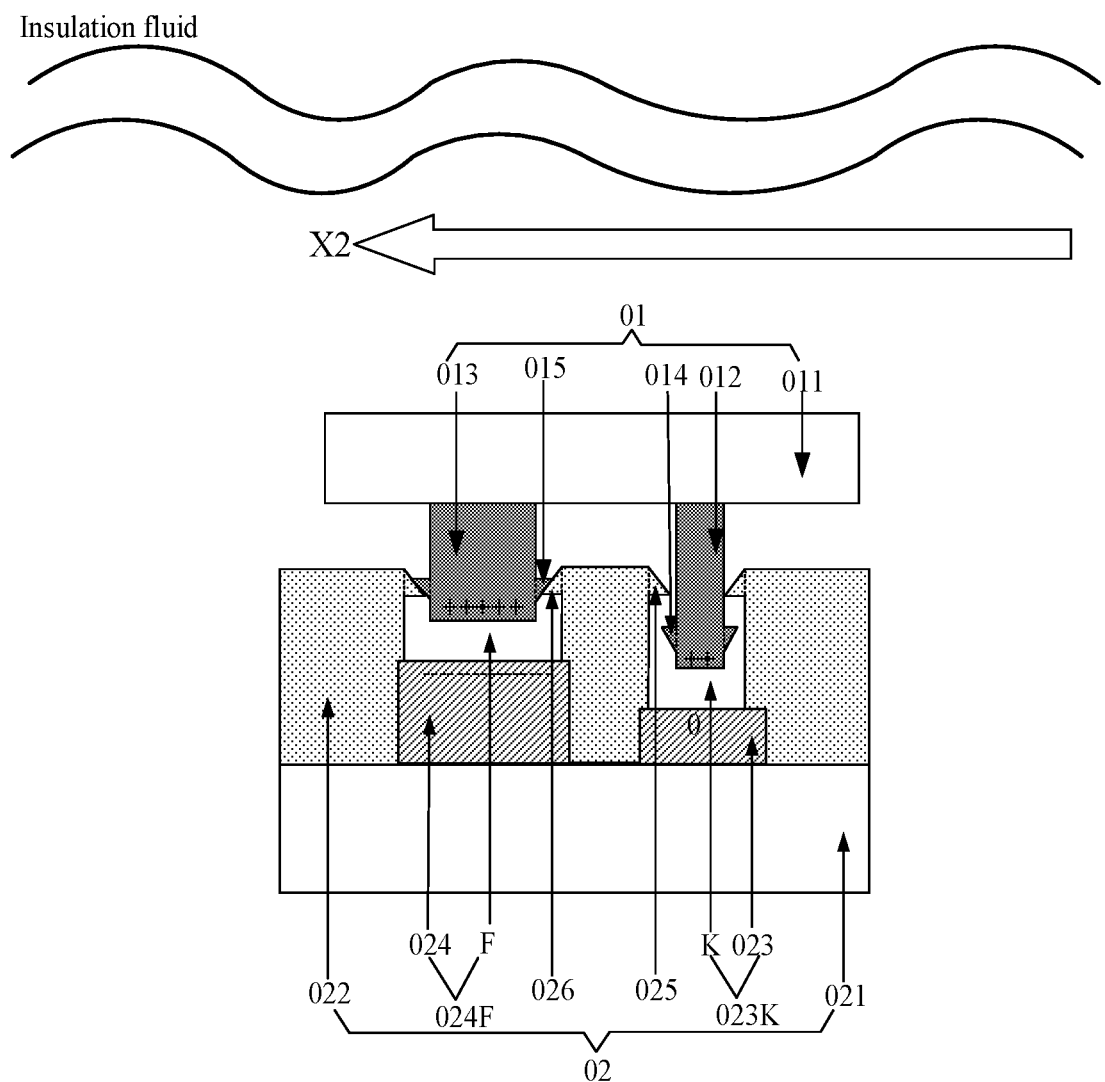

Illustratively, referring to FIG. 12, the insulation fluid in the sealed chamber flows in the second direction X2. A positive charge is applied to the first substrate bonding structure 023, the first chip bonding structure 012 and the second chip bonding structure 013, respectively. A negative charge is applied to the second substrate bonding structure 024, such that the electric potential of the second substrate bonding structure 024 is the fourth electric potential. Under the acting force of the insulation fluid, and the repulsive force between the first chip bonding structure 012 and the first substrate bonding structure 023 and the attraction force between the second chip bonding structure 013 and the second substrate bonding structure 024, the chip 01 rotates around the first chip bonding structure 012, such that the second chip bonding structure 013 moves close to the second substrate bonding structure 024. Referring to FIG. 13, the end, distal from the chip body 011, of the second chip bonding structure 013 enters the second alignment opening F, the second chip engaging portion 015 is engaged on the end, distal form the second substrate bonding structure 024, of the second substrate engaging portion 026, and the second chip bonding structure 013 is in a semi-fixed state.

In step 206, the electric potential of the second substrate bonding structure is increased, such that the second chip engaging portion passes through the second substrate engaging portion and is disposed between the second substrate engaging portion and the second substrate bonding structure, and the second chip engaging portion is engaged on the end, proximal to the second substrate bonding structure, of the second substrate engaging portion.

Optionally, the insulation fluid in the sealed chamber is kept flowing in the second direction, and the electric potential of the second substrate bonding structure is increased from the fourth electric potential to a fifth electric potential by controlling charge of the second substrate bonding structure, such that the attraction force between the second chip bonding structure and the second substrate bonding structure is increased. Under the acting force of the insulation fluid and the attraction force between the second chip bonding structure and the second substrate bonding structure, the second chip bonding structure continues to move close to the second substrate bonding structure, such that the second chip engaging portion passes through the second substrate engaging portion and is disposed between the second substrate engaging portion and the second substrate bonding structure, and the second chip engaging portion is engaged on the end, proximal to the second substrate bonding structure, of the second substrate engaging portion.

Figure 14:
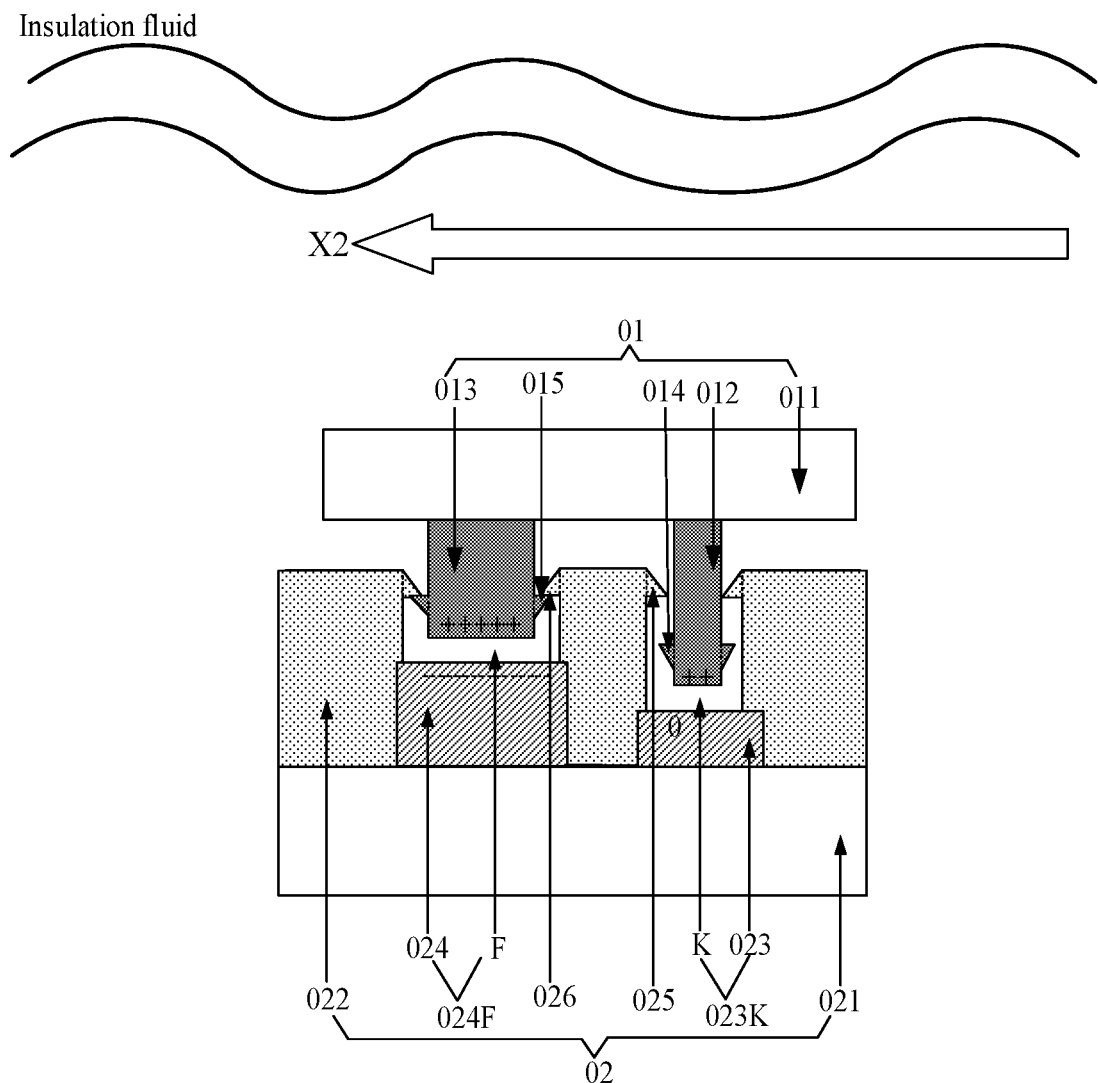

Illustratively, referring to FIG. 14, the insulation fluid in the sealed chamber is kept flowing in the second direction X2, and the electric potential of the second substrate bonding structure 024 is increased from the fourth electric potential to the fifth electric potential. Under the acting force of the insulation fluid and the attraction force between the second chip bonding structure 013 and the second substrate bonding structure 024, the second chip bonding structure 013 continues to move close to the second substrate bonding structure 024, the second chip engaging portion 015 passes through the second substrate engaging portion 026 and is disposed between the second substrate engaging portion 026 and the second substrate bonding structure 024, and the second chip engaging portion 015 is engaged on one end, proximal to the second substrate bonding structure 024, of the second substrate engaging portion 026.

As a repulsive force exists between the structures carrying charges of different polarities, and at least one of the first substrate bonding structure and the first chip bonding structure may be grounded prior to step 205, such that the influence of the repulsive force between the first substrate bonding structure and the first chip bonding structure on step 205 is avoided. For example, as shown in FIGS. 13 and 14, the first substrate bonding structure 023 is grounded.

In step 207, a bonding force is applied to the chip, such that the first chip bonding structure is bonded to the first substrate bonding structure, and the second chip bonding structure is bonded to the second substrate bonding structure.

Figure 15:
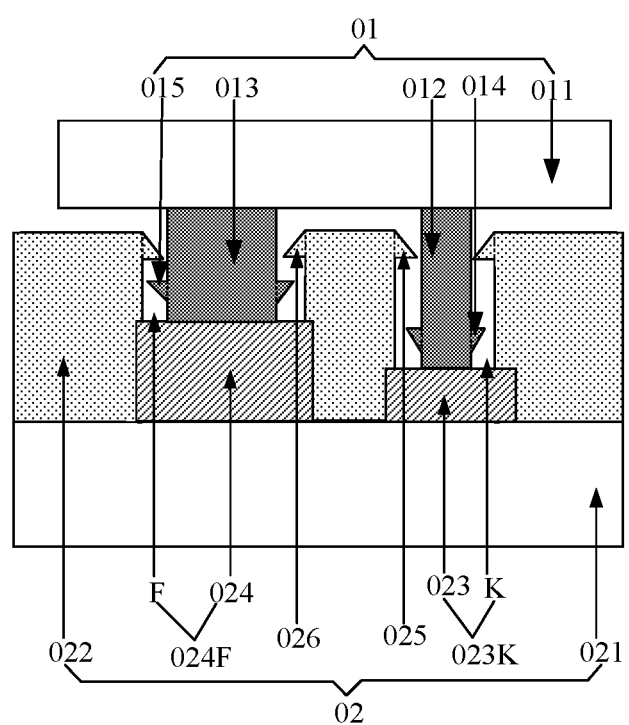

The bonding force may be applied to the chip, and a reflow or electroplating process is adopted to bond the first chip bonding structure to the first substrate bonding structure, and bond the second chip bonding structure to the second substrate bonding structure. After bonding, a display device can be obtained. For example, the display device may be as shown in FIG. 15.

Those skilled in the art can easily understand that steps 202 to 206 refer to the process of aligning the chip with the target substrate. During the alignment process, when the flow speed of the insulation fluid is constant, under combined action of the electrostatic force and the insulation fluid, the chip is subjected to an acceleration in the vertical direction and moves at a constant speed in the horizontal direction. Thus, the chip is only subjected to a vertical force, and may not be flipped. When the flow speed of the insulation fluid changes, the chip is subjected to a vertical force and a horizontal force, which may flip the chip, resulting in the failure of the alignment of the chip with the target substrate. In this case, the insulation fluid in the sealed chamber can be oscillated to flip the chip again, and then, steps 202 to 206 are performed again to align the chip with the target substrate.

In summary, in the method for transferring the chip according to the embodiments of the present disclosure, the chip is aligned with the target substrate by the insulation fluid in combination with the electrostatic force, which realizes batchwise transfer of the chips, and thus facilitates improvement of the chip transfer efficiency.

In the solution according to the embodiments of the present disclosure, in the insulation fluid, based on the acting force of the insulation fluid and the electrostatic force between the target substrate and the chip, the alignment between the chip and the target substrate is realized, the alignment between the target substrate and the chip is realized with high efficiency, low cost and high precision, and the method is applicable to transfer of a huge amount of chips.

Described above are embodiments of the method for transferring the chip according to the present disclosure, and a display device according to the embodiment of the present disclosure are described hereinafter.

An embodiment of the present disclosure provides a display device. The display device includes the target substrate and the chip according to the above embodiments, and the chip is transferred from the source substrate to the target substrate using the method for transferring the chip according to the above embodiment. The display device may be as shown in FIG. 15, and may be a display substrate, a display panel, electronic paper, a mobile phone, a tablet computer, a TV, a display, a notebook computer, a digital photo frame, a navigator, a wearable device, or any product or component having a display function.

Referring to FIG. 15, the display device includes a chip 01 and a target substrate 02. The chip 01 includes a first chip bonding structure 012 and a second chip bonding structure 013. The first chip bonding structure 012 is provided with a first chip engaging portion 014. The second chip bonding structure 013 is provided with a second chip engaging portion 015. The target substrate 02 includes a first alignment bonding structure 023K and a second alignment bonding structure 024F. The first alignment bonding structure 023K is provided with a first substrate engaging portion 025. The second alignment bonding structure 024F is provided with a second substrate engaging portion 026. The first chip bonding structure 012 is bonded to the first alignment bonding structure 023K, and the second chip bonding structure 013 is bonded to the second alignment bonding structure 024F. The first chip engaging portion 014 and the first substrate engaging portion 025 are configured to be engaged to each other during a process of aligning the first chip bonding structure 012 with the first alignment bonding structure 023K; and the second chip engaging portion 015 and the second substrate engaging portion 026 are configured to be engaged to each other during a process of aligning the second chip bonding structure 013 with the second alignment bonding structure 024F.

Optionally, each of the first chip engaging portion 014, the second chip engaging portion 015, the first substrate engaging portion 025 and the second substrate engaging portion 026 may be in an annular structure. The cross section of each of the first chip engaging portion 014, the second chip engaging portion 015, the first substrate engaging portion 025 and the second substrate engaging portion 026 is triangular or trapezoidal; and the cross sections are all parallel to the thickness direction of the target substrate 02.

Optionally, referring to FIG. 13, the target substrate 02 includes a bonding layer and an alignment layer 022 which are laminated. The bonding layer includes the first substrate bonding structure 023 and the second substrate bonding structure 024. The alignment layer 022 is provided with a first alignment opening K and a second alignment opening F. The first alignment bonding structure 023K includes the first substrate bonding structure 023 and the first alignment opening K provided with a first substrate engaging portion 025 on a side wall thereof. The second alignment bonding structure 024F includes the second substrate bonding structure 024 and the second alignment opening F provided with a second substrate engaging portion 026 on a side wall thereof. The first chip bonding structure 012 is bonded to the first substrate bonding structure 023 by the first alignment opening K; and the second chip bonding structure 013 is bonded to the second substrate bonding structure 024 by the second alignment opening F.

Optionally, in the target substrate 02, the first substrate bonding structure 023 is at least partially exposed by the first alignment opening K, and the second substrate bonding structure 024 is at least partially exposed by the second alignment opening F. For example, an orthographic projection of the first substrate bonding structure 023 on the alignment layer 022 covers the first alignment opening K, and an orthographic projection of the second substrate bonding structure 024 on the alignment layer 022 covers the second alignment opening F. In this way, a contact area between the chip bonding structure and the substrate bonding structure can be increased, thereby ensuring the effective bonding between the chip 01 and the target substrate 02.

Optionally, both the first alignment opening K and the second alignment opening F are alignment holes. The end, distal from the first substrate bonding structure 023, of the first alignment opening K is a flared opening, and the side surface of the first chip engaging portion 014 is engageable in the flared opening of the first alignment opening K and is attached to the side surface of the flared opening. The end, distal from the second substrate bonding structure 024, of the second alignment opening F is a flared opening, and the side surface of the second chip engaging portion 015 is engageable in the flared opening of the second alignment opening F and is attached to the side surface of the flared opening.

Optionally, referring to FIG. 15 in combination with FIG. 1, the first chip bonding structure 012 includes a first main pillar 0121, a first platform 0122, and a first auxiliary pillar 0123 which are sequentially stacked in a direction going away from the chip body 011. Axes of the first main pillar 0121, the first platform 0122 and the first auxiliary pillar 0123 are collinear on y1. The first platform 0122 has a first bottom surface and a second bottom surface parallel to each other. The size of the first bottom surface is greater than that of the second bottom surface. The second bottom surface of the first platform 0122, bottom surfaces of the first main pillar 0121 and bottom surfaces of the first auxiliary pillar 0123 are congruent. The first bottom surface of the first platform 0122 is stacked over one bottom surface of the first main pillar 0121. The second bottom surface of the first platform 0122 is stacked over one bottom surface of the first auxiliary pillar 0123, and a portion on the first platform 0122 protruding from the side surface of the first main pillar 0121 defines the first chip engaging portion 014. The second chip bonding structure 013 includes a second main pillar 0131, a second platform 0132, and a second auxiliary pillar 0133 which are sequentially stacked in a direction going away from the chip body 011, and axes of the second main pillar 0131, the second platform 0132 and the second auxiliary pillar 0133 are collinear on y2. The second platform 0132 has a first bottom surface and a second bottom surface parallel to each other. The size of the first bottom surface is greater than that of the second bottom surface. The second bottom surface of the second platform 0132, bottom surfaces of the second main pillar 0131 and bottom surfaces of the second auxiliary pillar 0133 are congruent. The first bottom surface of the second platform 0132 is stacked over one bottom surface of the second main pillar 0131. The second bottom surface of the second platform 0132 is stacked over one bottom surface of the second auxiliary pillar 0133, and a portion of the second platform 0132 protruding from the side surface of the second main pillar 0131 defines the second chip engaging portion 015. As shown in FIG. 15 in combination with FIG. 2, the first alignment opening K includes a first pillar-shaped through hole K1 and a first flared through hole K2 which are stacked in a direction going away from the first substrate bonding structure 023. The axes of the first pillar-shaped through hole K1 and the first flared through hole K2 are collinear on y3. The smaller opening in the two openings of the first flared through hole K2 is the first opening; the first opening of the first flared through hole K2 is communicated with one opening of the first pillar-shaped through hole K1; an orthographic projection of the first opening of the first flared through hole K2 on a plane where the first substrate bonding structure 023 is disposed falls within an orthographic projection of the first pillar-shaped through hole K1 on the plane where the first substrate bonding structure 023 is located; and a portion of the alignment layer 022 disposed in the first pillar-shaped through hole K1 defines the first substrate engaging portion 025. The second alignment opening F includes a second pillar-shaped through hole F1 and a second flared through hole F2 which are stacked in a direction going away from the second substrate bonding structure 024. The axes of the second pillar-shaped through hole F1 and the second flared through hole F2 are collinear on y4. The smaller opening in the two openings of the second flared through hole F2 is the first opening; the first opening of the second flared through hole F2 is communicated with one opening of the second pillar-shaped through hole F1; an orthographic projection of the first opening of the second flared through hole F2 on a plane where the second substrate bonding structure 024 is disposed falls within an orthographic projection of the second pillar-shaped through hole F1 on the plane where the second substrate bonding structure 024 is disposed; and a portion of the alignment layer 022 disposed in the second pillar-shaped through hole F1 defines the second substrate engaging portion 026. The size of the first bottom surface of the first platform 0122 is less than the aperture of the first pillar-shaped through hole K1 and is greater than the size of the first opening of the first flared through hole K2; the size of the first bottom surface of the second platform 0132 is less than the aperture of the second pillar-shaped through hole F1 and is greater than the size of the first opening of the second flared through hole F2; the size of the bottom surface of the second auxiliary pillar 0133 is greater than that of the second opening of the first flared through hole K2; and the second opening of the first flared through hole K2 is the greater opening in the two openings of the first flared through hole K2.

Optionally, the first main pillar 0121, the first auxiliary pillar 0123, the second main pillar 0131, and the second auxiliary pillar 0133 are all cylinders, and the first platform 0122 and the second platform 0132 are both circular truncated cones. The first pillar-shaped through hole K1 and the second pillar-shaped through hole F1 are both cylindrical, and openings of both the first flared through hole K2 and the second flared through hole F2 are circular. The diameter of the first bottom surface of the first platform 0122 is less than that of the first pillar-shaped through hole K1 and is greater than that of the first opening of the first flared through hole K2. The diameter of the first bottom surface of the second platform 0132 is less than that of the second pillar-shaped through hole F1 and is greater than that of the first opening of the second flared through hole F2. The diameter of the first bottom surface of the second auxiliary pillar 0133 is greater than that of the second opening of the first flared through hole K2.

Described hereinafter are embodiments of a method for manufacturing a chip and a method for manufacturing a target substrate according to the embodiments of the present disclosure.

An embodiment of the present disclosure provides a method for manufacturing a chip. The method for manufacturing the chip may be configured to manufacture the chip 01 in FIG. 1, and may include the following steps.

In step 401, a chip body is formed.

The chip body may include a carrier substrate, and a light-emitting unit and an encapsulation layer which are sequentially disposed on the carrier substrate. The light-emitting unit may include two laminated electrodes and a light-emitting layer disposed between the two electrodes. The two electrodes may include an anode and a cathode. Optionally, the light-emitting unit and the encapsulation layer may be sequentially formed on the carrier substrate to obtain the chip body.

In step 402, a first bonding sub-layer is formed on the chip body, wherein the first bonding sub-layer includes a first sub-pillar and a second main pillar.

The height of the first sub-pillar is equal to that of the second main pillar; and the size of the bottom surface of the first sub-pillar is less than that of the bottom surface of the second main pillar. When the first sub-pillar and the second main pillar are both cylindrical, the diameter of the first sub-pillar is less than that of the second main pillar. The first sub-pillar may be connected to the anode of the chip body, and the second main pillar may be connected to the cathode of the chip body. Both the first sub-pillar and the second main pillar may be made of a conductive material. The first sub-pillar and the second main pillar may be made of the same or different materials. The first sub-pillar and the second main pillar may be prepared by one-time patterning process. Optionally, both the first sub-pillar and the second main pillar may be made of a metal material or a semiconductor oxide.

Optionally, a metal material layer is obtained by depositing a layer of metal on the chip body by any one of processes such as magnetron sputtering, thermal evaporation and plasma enhanced chemical vapor deposition (PECVD), and the first bonding sub-layer is formed by the patterning process.

In step 403, a first photoresist layer is formed on the chip body on which the first bonding sub-layer has been formed, wherein the bottom surface of the first sub-pillar distal from the chip body, the bottom surface of the second main pillar distal from the chip body, and the surface of the first photoresist layer distal from the chip body are flush.

Optionally, a photoresist material layer is obtained by coating the chip body on which the first bonding sub-layer has been formed with a layer of a photoresist by a coating process, and then, is thinned (such as thinning by polishing) to expose the first sub-pillar and the second main pillar so as to obtain the first photoresist layer.

In step 404, a second photoresist layer is formed on the chip body on which the first photoresist layer has been formed, wherein the second photoresist layer includes a second platform-shaped photoresist structure, and a first bottom surface of the second platform-shaped photoresist structure is in contact with the bottom surface of the second main pillar distal from the chip body, and is not in contact with the bottom surface of the first sub-pillar distal from the chip body.

The first bottom surface of the second platform-shaped photoresist structure is the bottom surface with a larger area in the two bottom surfaces of the second platform-shaped photoresist structure. An orthographic projection of the first bottom surface of the second platform-shaped photoresist structure on the chip body can cover an orthographic projection of the second main pillar on the chip body. A distance between the boundary of the orthographic projection of the first bottom surface of the second platform-shaped photoresist structure on the chip body and the boundary of the orthographic projection of the second main pillar on the chip body may be in the range of 2 microns to 5 microns. The second platform-shaped photoresist structure may be in a shape of a circular truncated cone.

Optionally, a photoresist material layer is obtained by coating the chip body on which the first photoresist layer has been formed with a layer of a photoresist by the coating process, and is exposed, developed and baked sequentially to obtain the second platform-shaped photoresist structure, thereby obtaining the second photoresist layer. As the photoresist has fluidity, a slope may be formed in the baking process; and finally, the second platform-shaped photoresist structure is formed.

Optionally, prior to step 404, a second seed layer may be formed, and may be stacked over the second main pillar. An orthographic projection of the second seed layer on the chip body covers the orthographic projection of the second main pillar on the chip body. For example, a distance between the boundary of the orthographic projection of the second seed layer on the chip body and the boundary of the orthographic projection of the second main pillar on the chip body may be in the range of 2 microns to 5 microns. In the second photoresist layer prepared in step 404, the first bottom surface of the second platform-shaped photoresist structure may be in contact with and overlap with the surface of the second seed layer distal from the chip body. The second seed layer may be prepared by a sputtering process, and the thickness of the second seed layer is much less than the height of the second main pillar. Compared with the second main pillar, the second seed layer may be negligible.

In step 405, a third photoresist layer is formed on the chip body on which the second photoresist layer has been formed, the third photoresist layer is provided with a first pillar-shaped sub-hole and a second auxiliary pillar-shaped hole, an orthographic projection of the first pillar-shaped sub-hole on the chip body is coincided with the orthographic projection of the first sub-pillar on the chip body, and an orthographic projection of the second auxiliary pillar-shaped hole on the chip body is coincided with the second bottom surface of the second platform-shaped photoresist structure on the chip body.

The second bottom surface of the second platform-shaped photoresist structure is the bottom surface with a smaller area in the two bottom surfaces of the second platform-shaped photoresist structure. Optionally, a photoresist material layer is obtained by coating the chip body on which the second photoresist layer has been formed with a layer of a photoresist by the coating process, and the photoresist material layer is exposed and developed sequentially to obtain the third photoresist layer.

In step 406, the second platform-shaped photoresist structure is removed by using the third photoresist layer as a mask, such that a second flared hole in communication with the second auxiliary pillar-shaped hole is formed in the third photoresist layer.

Optionally, the second platform-shaped photoresist structure is removed by a developing process, such that the second flared hole in communication with the second auxiliary pillar-shaped hole is formed in the third photoresist layer. The shape of the second flared hole is the same as that of the outer contour of the second platform-shaped photoresist structure. A developing solution used in the developing process does not react with the first photoresist layer or the third photoresist layer except the second platform-shaped photoresist structure.

In step 407, a second bonding sub-layer is formed on the chip body on which the third photoresist layer has been formed and the second platform-shaped photoresist structure has been removed, wherein the second bonding sub-layer includes a second sub-pillar disposed in the first pillar-shaped sub-hole, a second platform disposed in the second flared hole, and a second auxiliary pillar disposed in the second auxiliary pillar-shaped hole; and the second main pillar, the second platform and the second auxiliary pillar are stacked to form the second chip bonding structure.

A portion on the second platform protruding from the side surface of the second main pillar defines the second chip engaging portion. The second sub-pillar, the second platform and the second auxiliary pillar may all be made of a conductive material, and may be prepared by one-time patterning process. For example, the second sub-pillar, the second platform, and the second auxiliary pillar may all be made of a metal material or a semiconductor oxide.

Optionally, a second bonding sub-layer is formed on the chip body on which the third photoresist layer has been formed and the second platform-shaped photoresist structure has been removed by an electroplating process. Optionally, prior to step 404, the second seed layer may be formed first, which may facilitate the electroplating process.

In step 408, a fourth photoresist layer is formed on the chip body on which the second bonding sub-layer has been formed, wherein the fourth photoresist layer is provided with a second pillar-shaped sub-hole, and an orthographic projection of the second pillar-shaped sub-hole on the chip body is coincided with the orthographic projection of the second sub-pillar on the chip body.

Optionally, a photoresist material layer is obtained by coating the chip body on which the second bonding sub-layer has been formed with a layer of a photoresist by the coating process. The photoresist material layer is exposed and developed sequentially, and the pillar-shaped sub-hole is formed in the photoresist material layer to obtain the fourth photoresist layer.

In step 409, a third bonding sub-layer is formed on the chip body on which the fourth photoresist layer has been formed, wherein the third bonding sub-layer includes a third sub-pillar disposed in the second pillar-shaped sub-hole; and the first sub-pillar, the second sub-pillar, and the third sub-pillar are sequentially stacked to form the first main pillar.

The third sub-pillar may be made of a conductive material. For example, the third sub-pillar may be made of a metal material or a semiconductor oxide. Optionally, the third sub-pillar is formed in the second pillar-shaped sub-hole by the electroplating or sputtering process, and thus the third bonding sub-layer is obtained.

In step 410, a fifth photoresist layer is formed on the chip body on which the third bonding sub-layer has been formed, wherein the fifth photoresist layer includes a first platform-shaped photoresist structure, and a first bottom surface of the first platform-shaped photoresist structure is in contact with the bottom surface of the first main pillar distal from the chip body.

The first bottom surface of the first platform-shaped photoresist structure is the bottom surface with a larger area in the two bottom surfaces of the first platform-shaped photoresist structure. Optionally, an orthographic projection of the first bottom surface of the first platform-shaped photoresist structure on the chip body covers an orthographic projection of the first main pillar on the chip body. A distance between the boundary of the orthographic projection of the first bottom surface of the first platform-shaped photoresist structure on the chip body and the boundary of the orthographic projection of the first main pillar on the chip body may be in the range of 2 microns to 5 microns.

Optionally, a photoresist material layer is obtained by coating the chip body on which the third bonding sub-layer has been formed with a layer of a photoresist by the coating process, and the photoresist material layer is exposed, developed and baked sequentially to obtain the first platform-shaped photoresist structure, thereby obtaining the fifth photoresist layer. As the photoresist has fluidity, a slope is formed in the baking process, thereby finally forming the first platform-shaped photoresist structure.

Optionally, prior to step 410, a first seed layer may further be formed, and may be stacked over the first main pillar. An orthographic projection of the first seed layer on the chip body covers the orthographic projection of the first main pillar on the chip body. For example, a distance between the boundary of the orthographic projection of the first seed layer on the chip body and the boundary of the orthographic projection of the first main pillar on the chip body may be in the range of 2 microns to 5 microns. In the fifth photoresist layer prepared in step 410, the first bottom surface of the first platform-shaped photoresist structure may be in contact with and overlap with the surface of the first seed layer away from the chip body. The first seed layer may be prepared by the sputtering process, and the thickness of the first seed layer is much less than the height of the first main pillar. Compared with the first main pillar, the first seed layer may be negligible.

In step 411, a sixth photoresist layer is formed on the chip body on which the fifth photoresist layer has been formed, wherein the sixth photoresist layer is provided with a first auxiliary pillar-shaped hole, and an orthographic projection of the first auxiliary pillar-shaped hole on the chip body is coincided with the orthographic projection of the second bottom surface of the first platform-shaped photoresist structure on the chip body.

The second bottom surface of the first platform-shaped photoresist structure is the bottom surface with a smaller area in the two bottom surfaces of the first platform-shaped photoresist structure. Optionally, a photoresist material layer is obtained by coating the chip body on which the fifth photoresist layer has been formed with a layer of a photoresist by the coating process, and the photoresist material layer is exposed and developed sequentially to obtain the sixth photoresist layer.

In step 412, the first platform-shaped photoresist structure is removed by using the sixth photoresist layer as a mask, such that a first flared hole in communication with the first auxiliary pillar-shaped hole is formed in the sixth photoresist layer.

Optionally, the first platform-shaped photoresist structure is removed by the developing process, such that the first flared hole in communication with the first auxiliary pillar-shaped hole is formed in the sixth photoresist layer. The shape of the first flared hole is the same as that of the outer contour of the first platform-shaped photoresist structure. None of the first photoresist layer, the third photoresist layer, the fourth photoresist layer, and the sixth photoresist layer reacts with a developing solution used in the developing process, and the developing solution only reacts with the first platform-shaped photoresist structure.

In step 413, a fourth bonding sub-layer is formed on the chip body on which the sixth photoresist layer has been formed and the first platform-shaped photoresist structure has been removed, wherein the fourth bonding sub-layer includes a first platform disposed in the first flared hole, and a first auxiliary pillar disposed in the first auxiliary pillar-shaped hole; and the first main pillar, the first platform, and the first auxiliary pillar are stacked to form the first chip bonding structure.

A portion of the first platform protruding from the side surface of the first main pillar defines the first chip engaging portion. The first platform and the first auxiliary pillar may be both made of a conductive material. The first platform and the first auxiliary pillar may be made of the same or different materials. Optionally, the first platform and the first auxiliary pillar may be made of a metal material or a semiconductor oxide.

Optionally, the fourth bonding sub-layer is formed on the chip body on which the sixth photoresist layer has been formed and the first platform-shaped photoresist structure has been removed by the electroplating process. Optionally, prior to step 410, the first seed layer may be formed first, which may facilitate the electroplating process.

In step 414, a remaining photoresist on the chip body is removed.

The chip 01 can be obtained after removing the remaining photoresist on the chip body. The chip 01 may be as shown in FIG. 1. The remaining photoresist on the chip body is removed by ashing.

An embodiment of the present disclosure provides a method for manufacturing a target substrate. The method for manufacturing the target substrate may be configured to manufacture the target substrate 02 as shown in FIG. 2 or FIG. 3, and may include the following steps.

In step 601, a base substrate is formed.

The base substrate may be a display backplate, which includes a glass substrate, and a TFT, a planarization layer, an electrode layer, and other structures that are sequentially disposed on the glass substrate. The electrode layer includes an anode and a cathode, and the anode is connected to the drain electrode of the TFT. Optionally, the TFT, the planarization layer, and the electrode layer may be sequentially formed on the glass substrate, and hence the base substrate is obtained.

In step 602, a first bonding sub-layer is formed on the base substrate, wherein the first bonding sub-layer includes a first bonding sub-structure and a first substrate bonding structure.

The first bonding sub-structure and the first substrate bonding structure may be both a pillar-shaped structure; the height of the first bonding sub-structure is equal to that of the first substrate bonding structure; and the bottom surface size of the first substrate bonding structure is less than that of the first bonding sub-structure. When the first bonding sub-structure and the first substrate bonding structure are both cylindrical, the diameter of the first substrate bonding structure is less than that of the first bonding sub-structure. The first substrate bonding structure may be connected to the anode of the base substrate, and the first bonding sub-structure may be connected to the cathode of the base substrate. The first substrate bonding structure and the first bonding sub-structure may be both made of a conductive material; the first substrate bonding structure and the first bonding sub-structure may be made of the same or different materials; and the first substrate bonding structure and the first bonding sub-structure may be prepared by one-time patterning process. Optionally, the first substrate bonding structure and the first bonding sub-structure may be made of a metal material or a semiconductor oxide such as ITO, IZO, or ZnO:Al.

Optionally, a metal material layer is obtained by depositing a layer of metal on the base substrate by any one of processes such as magnetron sputtering, thermal evaporation and PECVD, and is processed by one-time patterning process to obtain the first bonding sub-layer.

In step 603, a first photoresist layer is formed on the base substrate on which the first bonding sub-layer has been formed, wherein the first photoresist layer is provided with a first through hole, an orthographic projection of the first through hole on the base substrate is coincided with an orthographic projection of the first bonding sub-structure on the base substrate, and the first photoresist layer covers the first substrate bonding structure.

Optionally, a photoresist material layer is obtained by coating the base substrate on which the first bonding sub-structure has been formed with a layer of a photoresist by the coating process. The photoresist material layer is exposed and developed sequentially, such that the first through hole is formed in the photoresist material layer to obtain the first photoresist layer.

In step 604, a second bonding sub-layer is formed on the base substrate on which the first photoresist layer has been formed, wherein the second bonding sub-layer includes a second bonding sub-structure disposed in the first through hole, the second bonding sub-structure is stacked over the first bonding sub-structure to form a second substrate bonding structure, and the first bonding sub-layer and the second bonding sub-layer form a bonding layer.

The height of the second substrate bonding structure is greater than that of the first substrate bonding structure. The second bonding sub-structure may be made of a conductive material. Optionally, the second bonding sub-structure may be made of a metal material or a semiconductor oxide.

Optionally, a metal material layer is obtained by depositing a layer of metal on the base substrate on which the first photoresist layer has been formed by any one of processes such as magnetron sputtering, thermal evaporation and PECVD, and is processed by one-time patterning process to obtain the second bonding sub-structure, so as to obtain the second bonding sub-layer.

In step 605, the first photoresist layer is removed.

Optionally, the first photoresist layer is removed by ashing.

In step 606, a first alignment sub-layer is formed on the base substrate on which the bonding layer has been formed, wherein the first alignment sub-layer is provided with a first pillar-shaped through hole and a second pillar-shaped through hole, an orthographic projection of the first substrate bonding structure on the base substrate covers an orthographic projection of the first pillar-shaped through hole on the base substrate, and an orthographic projection of the second substrate bonding structure on the base substrate covers an orthographic projection of the second pillar-shaped through hole on the base substrate.

Optionally, a resin material layer is obtained by depositing a layer of resin on the base substrate on which the bonding layer has been formed by any one of processes such as magnetron sputtering, thermal evaporation and PECVD, and is processed by one-time patterning process to obtain the first alignment sub-layer.

In step 607, a second photoresist layer is formed on the base substrate on which the first alignment sub-layer has been formed, wherein the second photoresist layer includes a first pillar-shaped photoresist structure disposed in the first pillar-shaped through hole, and a second pillar-shaped photoresist structure disposed in the second pillar-shaped through hole.

The bottom surface of the first pillar-shaped photoresist structure distal from the base substrate, the bottom surface of the second pillar-shaped photoresist structure distal from the base substrate, and the surface of the first alignment sub-layer distal from the base substrate are flush. Optionally, a photoresist material layer is obtained by coating the base substrate on which the first alignment sub-layer has been formed with a layer of a photoresist, and is ground or ashed to remove a photoresist outside the first and second pillar-shaped through holes to obtain the second photoresist layer.

In step 608, a second alignment sub-layer is formed on the base substrate on which the second photoresist layer has been formed, wherein the second alignment sub-layer is provided with a first flared through hole and a second flared through hole, an orthographic projection of a first opening of the first flared through hole on the base substrate falls within an orthographic projection of the first pillar-shaped through hole on the base substrate, and an orthographic projection of a first opening of the second flared through hole on the base substrate falls with an orthographic projection of the second pillar-shaped through hole on the base substrate.

The first opening of the first flared through hole is the smaller opening in the two openings of the first flared through hole, and the first opening of the second flared through hole is the smaller opening in the two openings of the second flared through hole. Optionally, forming the second alignment sub-layer includes: depositing a layer of resin on the base substrate on which the second photoresist layer has been formed by any of processes such as magnetron sputtering, thermal evaporation and PECVD such that a resin material layer is obtained, and processing the resin material layer through the one-step patterning process, and baking the processed resin material layer, and forming the first and second flared through holes in the resin material layer such that the second alignment sub-layer is obtained. As the resin has fluidity, a slope may be formed during the baking process, thereby forming the first flared through hole and the second flared through hole.

In step 609, the first pillar-shaped photoresist structure and the second pillar-shaped photoresist structure are removed, such that the first flared through hole is communicated with the first pillar-shaped through hole to form a first alignment opening, the second flared through hole is communicated with the second pillar-shaped through hole to form a second alignment opening, and the first alignment sub-layer and the second alignment sub-layer are stacked to form the alignment layer.

Optionally, a developing process may be adopted to remove the first and second pillar-shaped photoresist structures. After the first and second pillar-shaped photoresist structures are removed, the target substrate 02 can be obtained. The target substrate 02 may be as shown in FIG. 2 or FIG. 3. A portion of the alignment layer disposed in the first pillar-shaped through hole defines the first substrate engaging portion, and a portion of the alignment layer disposed in the second cylindrical through hole defines the second substrate engaging portion.

In the above embodiments of the present disclosure, the one-time patterning process may include: coating a photoresist, exposing, developing, etching, and stripping the photoresist.

Described above are merely exemplary embodiments of the present disclosure, but are not intended to limit the present disclosure. Any modifications, equivalent replacements, improvements and the like made within the spirit and principles of the present disclosure should be included within the scope of protection of the present disclosure.

What is claimed is:

1. A method for transferring a chip, comprising:
   disposing a target substrate in a sealed chamber, wherein the target substrate comprises a first alignment bonding structure and a second alignment bonding structure, and the chip comprises a first chip bonding structure and a second chip bonding structure;
   applying a charge of a first polarity to the first alignment bonding structure, applying a charge of a second polarity to the first chip bonding structure, and injecting an insulation fluid flowing in a first direction into the sealed chamber, such that the first chip bonding structure is aligned with the first alignment bonding structure, wherein the first polarity is different from the second polarity;
   applying the charge of the first polarity to the first alignment bonding structure, the first chip bonding structure and the second chip bonding structure respectively, applying the charge of the second polarity to the second alignment bonding structure, and changing the insulation fluid to flow in a second direction, such that the second chip bonding structure is aligned with the second alignment bonding structure, wherein the second direction is different from the first direction; and
   applying a bonding force to the chip, such that the first chip bonding structure is bonded to the first alignment bonding structure and the second chip bonding structure is bonded to the second alignment bonding structure.

2. The method according to claim 1, wherein the first alignment bonding structure comprises a first substrate bonding structure and a first alignment opening provided with a first substrate engaging portion on a side wall thereof, the second alignment bonding structure comprises a second substrate bonding structure and a second alignment opening provided with a second substrate engaging portion on a side wall thereof, the first chip bonding structure is provided with a first chip engaging portion, and the second chip bonding structure is provided with a second chip engaging portion; and applying the charge of the first polarity to the first alignment bonding structure, applying the charge of the second polarity to the first chip bonding structure, and injecting the insulation fluid flowing in the first direction into the sealed chamber, such that the first chip bonding structure is aligned with the first alignment bonding structure comprises:
   applying the charge of the first polarity to the first substrate bonding structure, applying the charge of the second polarity to the first chip bonding structure, and injecting the insulation fluid flowing in the first direction into the sealed chamber, such that the first chip bonding structure enters the first alignment opening, the first chip engaging portion is engaged on an end distal from the first substrate bonding structure of the first substrate engaging portion, and the second chip bonding structure is outside the second alignment opening; and
   increasing an electric potential of the first substrate bonding structure, such that the first chip engaging portion passes through the first substrate engaging portion and is disposed between the first substrate engaging portion and the first substrate bonding structure, wherein the first chip bonding structure is in contact with the first substrate bonding structure.

3. The method according to claim 2, wherein after the first chip bonding structure is in contact with the first substrate bonding structure, the method further comprises:
   reducing the electric potential of the first substrate bonding structure, such that the first chip bonding structure is movable away from the first substrate bonding structure, wherein the first chip engaging portion is engaged on an end proximal to the first substrate bonding structure of the first substrate engaging portion.

4. The method according to claim 3, wherein applying the charge of the first polarity to the first alignment bonding structure, the first chip bonding structure and the second chip bonding structure respectively, applying the charge of the second polarity to the second alignment bonding structure, and changing the insulation fluid to flow in the second direction, such that the second chip bonding structure is aligned with the second alignment bonding structure comprises:
   applying the charge of the first polarity to the first alignment bonding structure, the first chip bonding structure and the second chip bonding structure respectively, applying the charge of the second polarity to the second substrate bonding structure, and changing the insulation fluid to flow in the second direction, such that the second chip bonding structure enters the second alignment opening, wherein the second chip engaging portion is engaged on an end distal from the second substrate bonding structure of the second substrate engaging portion; and
   increasing an electric potential of the second substrate bonding structure, such that the second chip engaging portion passes through the second substrate engaging portion and is disposed between the second substrate engaging portion and the second substrate bonding structure, wherein the second chip engaging portion is engaged on an end proximal to the second substrate bonding structure of the second substrate engaging portion.

5. The method according to claim 3, wherein
prior to injecting the insulation fluid flowing in the first direction into the sealed chamber, the method further comprises:

applying the charge of the second polarity to the second chip bonding structure; and after the first chip engaging portion is engaged on the end proximal to the first substrate bonding structure of the first substrate engaging portion, the method further comprises:

grounding the first substrate bonding structure.

6. A chip, comprising: a chip body, and a first chip bonding structure provided with a first chip engaging portion and a second chip bonding structure provided with a second chip engaging portion on the chip body; wherein the first chip bonding structure is configured to be bonded to a first alignment bonding structure of a target substrate, and the second chip bonding structure is configured to be bonded to a second alignment bonding structure of the target substrate, wherein the first chip engaging portion is configured to be engaged to a first substrate engaging portion of the first alignment bonding structure during a process of aligning the first chip bonding structure with the first alignment bonding structure, and the second chip engaging portion is configured to be engaged to a second substrate engaging portion of the second alignment bonding structure during a process of aligning the second chip bonding structure with a second alignment bonding structure.

7. The chip according to claim 6, wherein the first chip engaging portion and the second chip engaging portion are both annular structures.

8. The chip according to claim 6, wherein shapes of cross sections of the first chip engaging portion and the second chip engaging portion are both triangular or trapezoidal; and the cross sections are parallel to a height direction of the chip body.

9. The chip according to claim 8, wherein the first chip bonding structure comprises a first main pillar, a first platform and a first auxiliary pillar which are sequentially stacked in a direction going away from the chip body, wherein axes of the first main pillar, the first platform and the first auxiliary pillar are collinear, the first platform is provided with a first bottom surface and a second bottom surface parallel to each other, wherein a size of the first bottom surface is greater than a size of the second bottom surface, the second bottom surface, bottom surfaces of the first main pillar and bottom surfaces of the first auxiliary pillar are congruent, the first bottom surface is stacked over one bottom surface of the first main pillar, the second bottom surface is stacked over one bottom surface of the first auxiliary pillar, and a portion of the first platform protruding from a side surface of the first main pillar defines the first chip engaging portion; and the second chip bonding structure comprises a second main pillar, a second platform and a second auxiliary pillar which are sequentially stacked in the direction distal from the chip body, wherein axes of the second main pillar, the second platform and the second auxiliary pillar are collinear, and the second platform is provided with a first bottom surface and a second bottom surface parallel to each other, wherein a size of the first bottom surface is greater than a size of the second bottom surface, the second bottom surface, bottom surfaces of the second main pillar and bottom surfaces of the second auxiliary pillar are congruent, the first bottom surface is stacked over one bottom surface of the second main pillar, the second bottom surface is stacked over one bottom surface of the second auxiliary pillar, and a portion of the second platform protruding from a side surface of the second main pillar defines the second chip engaging portion.

10. The chip according to claim 9, wherein the first main pillar, the first auxiliary pillar, the second main pillar and the second auxiliary pillar are all cylinders; and the first platform and the second platform are both circular truncated cones.

11. A display device, comprising: a chip as defined in claim 6, and a target substrate comprising a base substrate, and a first alignment bonding structure provided with a first substrate engaging portion and a second alignment bonding structure provided with a second substrate engaging portion on the base substrate; wherein the first chip bonding structure is bonded to the first alignment bonding structure and the second chip bonding structure is bonded to the second alignment bonding structure, wherein the first chip engaging portion and the first substrate engaging portion are configured to be engaged to each other during a process of aligning the first chip bonding structure with the first alignment bonding structure, and the second chip engaging portion and the second substrate engaging portion are configured to be engaged to each other during a process of aligning the second chip bonding structure with the second alignment bonding structure.

12. The display device according to claim 11, wherein the target substrate comprises a bonding layer and an alignment layer which are stacked;

wherein the bonding layer comprises a first substrate bonding structure and a second substrate bonding structure, and the alignment layer is provided with a first alignment opening and a second alignment opening;

the first alignment bonding structure comprises the first substrate bonding structure and the first alignment opening provided with the first substrate engaging portion on a side wall thereof, and the second alignment bonding structure comprises the second substrate bonding structure and the second alignment opening provided with the second substrate engaging portion on a side wall thereof; and the first chip bonding structure is bonded to the first substrate bonding structure by the first alignment opening; and the second chip bonding structure is bonded to the second substrate bonding structure by the second alignment opening.

13. A target substrate, comprising: a base substrate, and a first alignment bonding structure provided with a first substrate engaging portion and a second alignment bonding structure provided with a second substrate engaging portion on the base substrate; wherein the first alignment bonding structure is configured to be bonded to a first chip bonding structure of a chip, and the second alignment bonding structure is configured to be bonded to a second chip bonding structure of the chip, wherein the first substrate engaging portion is configured to be engaged to a first chip engaging portion of the first chip bonding structure during a process of aligning the first chip bonding structure with the first alignment bonding structure, and the second substrate engaging portion is configured to be engaged to a second chip engaging portion of the second chip bonding structure during a process of aligning the second chip bonding structure with the second alignment bonding structure.

14. The target substrate according to claim 13, comprising a bonding layer and an alignment layer which are laminated, wherein the bonding layer comprises a first substrate bonding structure and a second substrate bonding structure, the alignment layer is provided with a first alignment opening and a second alignment opening, the first alignment bonding structure comprises the first substrate bonding structure and the first alignment opening provided with the first substrate engaging portion on a side wall thereof, and the second alignment bonding structure comprises the second substrate bonding structure and the second alignment opening provided with the second alignment opening on a side wall thereof;

wherein the first substrate bonding structure is configured to be bonded to the first chip bonding structure by the first alignment opening, and the second substrate bonding structure is configured to be bonded to the second chip bonding structure by the second alignment opening.

15. The target substrate according to claim 14, wherein an orthographic projection of the first substrate bonding structure on the alignment layer covers the first alignment opening, and an orthographic projection of the second substrate bonding structure on the alignment layer covers the second alignment opening.

16. The target substrate according to claim 14, wherein the first substrate engaging portion and the second substrate engaging portion are both annular structures.

17. The target substrate according to claim 16, wherein shapes of cross sections of the first substrate engaging portion and the second substrate engaging portion are both triangular or trapezoidal; and the cross sections are parallel to a thickness direction of the base substrate.

18. The target substrate according to claim 17, wherein the first alignment opening and the second alignment opening are both alignment holes; and an end distal from the first substrate bonding structure of the first alignment opening is a flared opening, and an end distal from the second substrate bonding structure of the second alignment opening, is a flared opening.

19. The target substrate according to claim 18, wherein the first alignment opening comprises a first pillar-shaped through hole and a first flared through hole which are stacked in a direction going away from the base substrate, wherein axes of the first pillar-shaped through hole and the first flared through hole are collinear, and a smaller opening in two openings of the first flared through hole is a first opening, wherein the first opening of the first flared through hole is communicated with an opening of the first pillar-shaped through hole, an orthographic projection of the first opening of the first flared through hole on the base substrate falls within an orthographic projection of the first pillar-shaped through hole on the base substrate, and a portion of the alignment layer in the first pillar-shaped through hole defines the first substrate engaging portion; and the second alignment opening comprises a second pillar-shaped through hole and a second flared through hole which are stacked in the direction going away from the base substrate, wherein axes of the second pillar-shaped through hole and the second flared through hole are collinear, and a smaller opening in two openings of the second flared through hole is a first opening, wherein the first opening of the second flared through hole is communicated with one opening of the second pillar-shaped through hole, an orthographic projection of the first opening of the second flared through hole on the base substrate falls within an orthographic projection of the second pillar-shaped through hole on the base substrate, and a portion of the alignment layer in the second pillar-shaped through hole defines the second substrate engaging portion.

20. The target substrate according to claim 19, wherein the first pillar-shaped through hole and the second pillar-shaped through hole are both cylindrical, and openings of both the first flared through hole and the second flared through hole are circular.

* * * * *